(12) United States Patent
Morishita

(10) Patent No.: US 6,545,321 B2
(45) Date of Patent: Apr. 8, 2003

(54) ESD PROTECTION CIRCUIT FOR A SEMICONDUCTOR INTEGRATED CIRCUIT

(75) Inventor: Yasuyuki Morishita, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 10/099,708

(22) Filed: Mar. 15, 2002

(65) Prior Publication Data

US 2002/0130366 A1 Sep. 19, 2002

(30) Foreign Application Priority Data

Mar. 19, 2001 (JP) ........................................ 2001-078195
Oct. 31, 2001 (JP) ........................................ 2001-335348
Mar. 8, 2002 (JP) ........................................ 2002-063771

(51) Int. Cl.[7] .............................................. H01L 23/62
(52) U.S. Cl. ....................................... 257/355; 257/141
(58) Field of Search ................................ 257/355, 356, 257/357, 358, 359, 360, 361, 362, 363, 364, 365, 111, 112, 119, 121, 123, 124, 126, 127, 173, 174, 133, 134, 167, 175

(56) References Cited

FOREIGN PATENT DOCUMENTS

JP        10-313110        11/1998

OTHER PUBLICATIONS

"A Low–Voltage Triggering SCR For On–Chip ESD Protection At Output and Input Pads" by. Amitava Chatterjee and Thomas Polgreen 1990 Symposium on VLSI Technology, p.75–76 1990 IEEE.

*Primary Examiner*—Long Pham
*Assistant Examiner*—Dana Farahani
(74) *Attorney, Agent, or Firm*—Katten Muchin Zavis Rosenman

(57) ABSTRACT

When an ESD surge positive against a ground terminal is loaded on the input/output pad, a breakdown current of the n-channel MOS transistor flows via forward-biased diodes consist of a p+ diffusion layer and N well from the input/output pad. As a result, a SCR that comprises a p+ diffusion layer serving as the anodes of the diodes, N well, P well, and n+ diffusion layer serving as the source of the transistor is activated, and then the ESD surge is released to the ground terminal.

16 Claims, 26 Drawing Sheets

ESD PROTECTION CIRCUIT FOR A SEMICONDUCTOR INTEGRATED CIRCUIT

BACKGROUND OR THE INVENTION

1. Field of the Invention

This invention relates to an electrostatic discharge (ESD) protection Circuit for a semiconductor integrated circuit suitable for use in preventing the destruction of internal devices caused by an ESD surge and the likes This invention particularly relates to an ESD protection circuit for a semiconductor integrated circuit of which protection performance has been enhanced.

2. Description of the Related Art

Semiconductor integrated circuits (ICs) are required to be resistant to surge voltage and surge current that are caused by electrostatic discharge (ESD) that is loaded on the input/output pad of IC. In general, to meet this requirement, an ESD protection circuit is connected to the input/output pad of IC. FIG. 1A is a sectional view illustrating the structure of a prior art ESD protection circuit, and FIG. 1B is an equivalent circuit diagram thereof.

Referring now to FIG. 1A, in the prior art ESD protection circuit, a p-type epitaxial layer 102 is deposited onto a p-type semiconductor substrate 101, and an N well NW101 and a P well PW101 are ford on its surface. On the surface of the boundary between the N well NW101 and P well PW1021 an n+ diffusion layer ND102 is formed.

On the surface of the N well NW101, an n+ diffusion layer ND101 is formed apart from the n+ diffusion layer ND102, while a p+ diffusion layer PD101 is formed between the n+ diffusion layer ND102 and n+ diffusion layer ND101. These diffusion layers are electrically isolated from each other by shallow trench isolation (STI) films.

On the other hand, an n+ diffusion layer ND103 is formed apart from the n+ diffusion layer ND102 on the surface of the P well PW101, and a p+ diffusion layer PD102 is formed further away from the n+ diffusion layer ND102 The n+ diffusion layer ND103 and p+ diffusion layer PD102 are electrically isolated by another STI film. A conductive film 104 is formed on a p-type epitaxial layer 102 between the n+ diffusion layer ND102 and n+ diffusion layer ND103 via a gate dielectric film (not shown). An n-channel MOS transistor NMOS is formed by this conductive film 104 serving as the gate electrode, the n+ diffusion layer ND103 as the source and the n+ diffusion layer ND102 as the drain.

An input/output pad I/O is connected to the n+ diffusion layer ND101 and p+ diffusion layer PD101, while the conductive film 104, n+ diffusion layer ND103 and p+ diffusion layer PD102 are connected to a ground terminal GND.

As shown in FIG. 1B, in such an ESD protection circuit, the p+ diffusion layer PD101, N well NW101 and P well PW101 constitute a transistor Tr101, while N well NW101, P well PW101 and n+ diffusion layer ND103 constitute a transistor Tr2. Namely, the p+ diffusion layer PD101, N well NW101, P well PW101 and n+ diffusion layer ND103 constitute a silicon controlled rectifier (SCR). The N well NW101 and P well PW101 have parasitic resistances Rnw and Rpw, respectively.

When a surge positive to the ground terminal GND is applied to the input/output pad I/O, a breakdown occurs between the drain (n+ diffusion layer ND102) and the channel (P well PW101) of the transistor NMOS, and then a trigger current Itrig flows from the n+ diffusion layer ND101 to the ground terminal GND via the N well NW101, n+ diffusion layer ND102 and P well PW101. As a result, the potential of the N well NW101 becomes lower than that of the input/output pad I/O due to the parasitic resistance Rnw parasitizing the N well NW101, and the potential of the P well PW101 becomes higher than that of the ground terminal GND due to the parasitic resistance Rpw parasitizing the P well PW101. Then the SCR, which comprises the p+ diffusion layer PD101, N well NW101, P well PW101 and n+ diffusion layer ND103, is activated. At this time, a large current Iscr flows to the ground terminal GND from the input/output pad I/O. As a result, the urge applied to the input/output pad I/O runs away to the ground terminal without damage of its internal circuit.

Examples of such an ESD protection circuit are disclosed in Japanese Patent Publication Laid-Open No Hei. 10-50494 and Japanese Patent Publication Laid-Open No. Hei. 10-313110, U.S. Pat. No. 5,465,189, and "1990 Symposium on VLSI Technology 6B-5" p. 75–76, for example.

FIG. 2A is a sectional view illustrating the structure of another prior art ESD protection circuit, and FIG. 2B is an equivalent circuit diagram thereof. Such a prior art ESD protection circuit is disclosed in U.S. Pat. No. 5,465,189, for example. Referring now to FIGS. 2A and 2B, the n+ diffusion layer ND101 is not connected to the input/output pad I/O but the power supply voltage terminal VDD in this prior art ESD protection circuit. The input/output pad I/O is connected only to the p+ diffusion layer PD101. Except for this difference, this prior art ESD protection circuit has the same structure as that of the prior at ESD protection circuit shown in FIGS. 1A and 1B.

In the above prior art ESD protection circuits, there exists the drain (n+ diffusion layer ND102) of the transistor NMOS between the anode and the cathode of the SCR. Thus the distance Lscr between the anode and cathode becomes rather long, about 2–3 μm, even if the technology of the 0.18 μm-generation is applied to the gate, and a sufficiently good ESD performance is not obtained this is because the discharging capability of the SCR degrades, as distance Lscr becomes longer.

FIG. 3A is a sectional view illustrating the structure of another prior art ESD protection circuit, and FIG. 3B is an equivalent circuit diagram thereof. Referring now to FIGS. 3A and 3B, compared with the prior art ESD protection circuit shown in FIGS. 2A and 2B, an n+ diffusion layer ND104 is formed instead of the transistor NMOS and the p+ diffusion layer PD102, and a device isolation film STI is formed between the p+ diffusion layer PD101 and the n+ diffusion layer ND104. The n+ diffusion layer ND104 is connected to a ground terminal GND. Besides, the N well NW101 extends to beneath the device isolation film STI between the p+ diffusion layer PD101 and the n+ diffusion layer ND104. In the other parts of structure, this prior art ESD protection circuit is the same as the prior art ESD protection circuit shown in FIGS. 2A and 2B.

In the prior art ESD protection circuit shown in FIGS. 3A and 3B, the anode-cathode distance Lacr can be reduced because there is no n+ diffusion layer formed between the N well NW101 and the P well FW101.

However, the prior art ESD protection circuits have the following drawbacks. In the ESD protection circuits shown in FIGS. 1A, 1B and FIGS. 2A, 2B, the breakdown in the boundary between the n+ diffusion layer ND102, that is the drain of the MOS transistor NMOS, and P well PW101 become, the trigger voltage (Vtrig) of the SCR. In this case, the breakdown can be controlled by changing the structure of the MOS transistor NMOS, then, the trigger voltage of the SCR can be set at the value lower than the tolerance voltage of the circuit to be protected (not shown) being connected to the input/output pad I/O. However, the SCR must be large size to achieve the adequate ESD performance because of the poor discharge ability of the SCR due to large distance Lscr. AS the result, the parasitic capacitance of the ESD protection circuit becomes large, so the ESD protection circuit can use for a high-speed interface circuit.

Meanwhile, in the ESD protection circuit shown in FIGS. 3A and 3B, the distance Lscr can be reduced. But in this EST protection circuit, the breakdown in the boundary between the N well NW101 and P well PW101 determines the trigger voltage (Vtrig) of the SCR. The trigger voltage of the SCR cannot be set at the value lower than the tolerance voltage of the circuit to be protected because the breakdown in the boundary between the N well and P well becomes as high as a few tens volts. Thus, the circuit to be protected is destructed before the ESD protection circuit becomes active with breakdown.

It is hard to achieve both of enhance of discharge ability with small distance Lscr and reduction of the trigger voltage in the conventional ESD protection circuit. However, in recent years, the 0.10 μm CMOS technology is adopted in semiconductor circuit and the gate oxide films of MOS transistors comprising the internal circuit is thinner than 2 nm. Then, an ESD protection circuit, having both of higher discharge ability and lower trigger voltage than the conventional one, is requested to protect such a semiconductor integrated circuit.

SUMMARY OF THE INVENTION

An object of the present invention is to provide an ESD protection circuit for a semiconductor integrated circuit having both of high discharge ability and low trigger voltage.

An ESD protection circuit for a semiconductor integrated circuit in accordance with the present invention comprises: a 1st-conductivity type semiconductor substrate a 2nd-conductivity type well formed in the semiconductor substrate; a first 1st-conductivity type diffusion layer, being formed in the 2nd-conductivity type well, that is connected to a pad; a first 2nd-conductivity type diffusion layer, being formed in the 2nd-conductivity type well; a second 2nd-conductivity type diffusion layer, formed in a part other than the 2nd-conductivity type well of the semiconductor substrate, that is connected to a reference voltage terminal; and a trigger device having two terminals in which the one terminal is connected to the first 2nd-conductivity type diffusion layer via wiring and in which the other terminal is connected to a reference voltage terminal, for allowing electric current to flow when a voltage higher than a predetermined value is applied between the two terminals.

In the present invention, when a surge positive against the reference voltage terminal is applied to the pad, a voltage is applied to the trigger device through the first 1st-conductivity type diffusion layer, the 2nd-conductivity type well, the first 2nd-conductivity type diffusion layer and the wiring. Then a trigger current flows to the trigger device. As a result, the trigger current acts as a base current of the transistor that consists of the first 1st-conductivity type diffusion layer, 2nd-conductivity type well and 1st-conductivity type semiconductor substrate, the transistor turns on. So, the SCR that consists of the first 1st-conductivity type diffusion layer, 2nd-conductivity type well, 1st-conductivity type semiconductor substrate and the second 2nd-conductivity type diffusion layer turns on, and a large current due to the ESD surge flows toward the reference voltage terminal. The surge loaded on the pad is thereby released.

Also in the present invention, since the trigger device is connected with the wiring to the first 2nd-conductivity type diffusion layer, the trigger device can be located outside the SCR. As a result, the base length of the SCR, this is the distance Lscr, can be reduced, and the ESD performance can be improved. Since the trigger voltage of the SCR can be controlled by changing the characteristics of the trigger device and the trigger device can be designed independently of the SCR, the trigger voltage can be set at an arbitrary value. Then, the ESD protection circuit for a semiconductor integrated circuit having both of high discharge ability and low trigger voltage can be achieved. As a result, the signal voltage applied to the pad has a large margin. Besides, in case of using a circuit to be protected having an extremely thin gate oxide film of the 0.10 μm generation, this circuit can be protected by controlling the trigger voltage to be lower than the tolerance voltage of the circuit. Also, the parasitic capacitance can be reduced because the size of the SCR can be smaller. Then, the ESD protection circuit can use for a high-speed interface circuit.

In the present invention, the pad is connected to the trigger device via the first 1st-conductivity type diffusion layer, 2nd-conductivity type well and the first 2nd-conductivity type diffusion layer but directly, then the possible destruction of the trigger device before turning on the SCR can be prevented.

Also, if a current flows from the pad to the trigger device directly, the current doesn't flow in a transistor of a SCR, then, the current doesn't act the base current of the transistor. Contrarily, in the present invention, the current flows from the pad to the base of the transistor, which case the SCR. Then, the SCR can turn-on immediately when the surge is applied to the pad.

According to the present invention, the trigger device can be located outside the SCR, because the trigger device in the ESD protection circuit is connected to the base of the transistor forming the SCR via a metallic wire. Then the length of the base of the SCR can be reduced and the ESD performance is thereby improved. In addition, since the trigger voltage of the SCR can be controlled by changing the characteristics of the trigger device, the trigger voltage can be set at a desired value. As a result, the signal voltage applied to the input/output pad has a large voltage margin. Further, even when a MOS transistor having extremely thin gate oxide film of the 0.10 μm generation is used, the gate oxide films can be protected from destruction.

DETAILED DESCRIPTION OF THE PREFERRED EMBODIMENTS

Figure 4:
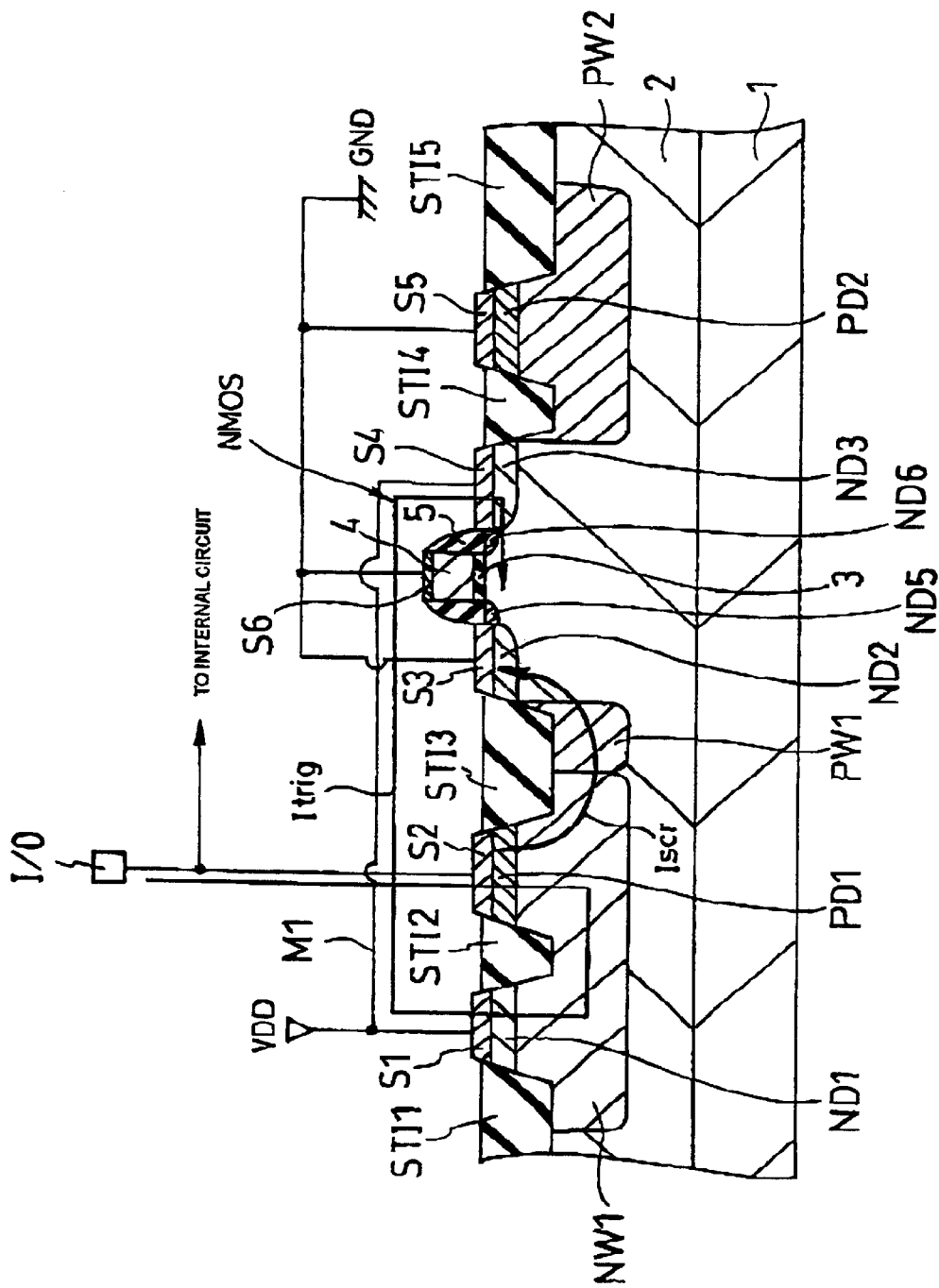
FIG. 4 is a sectional view illustrating the structure of an ESD protection circuit according to a first embodiment of the present invention.

Now ESD protection circuits for a semiconductor integrated circuit in accordance with embodiments of the present invention will be specifically described with reference to the accompanying drawings. FIG. 4 is a sectional view of an ESD protection circuit according to a first embodiment of the present invention, FIG. 5A is its equivalent circuit diagram, and FIG. 5B is its layout diagram.

Figure 5A:
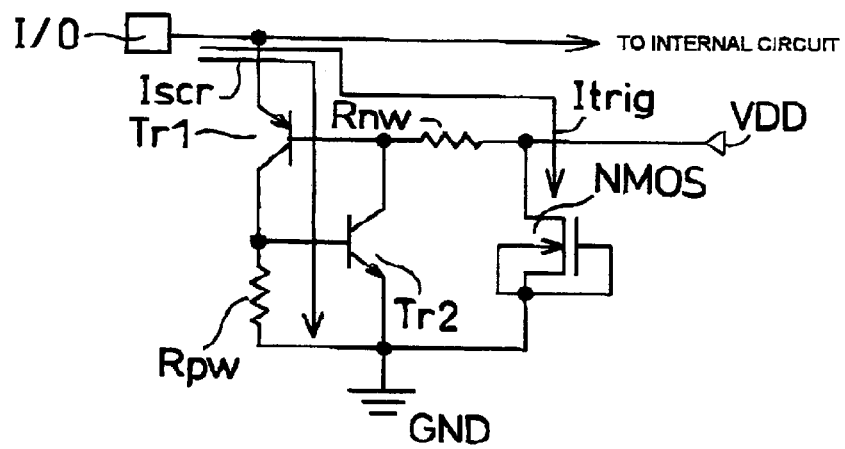
FIG. 5A is an equivalent circuit showing the ESD protection circuit according to the first embodiment.
Figure 5B:
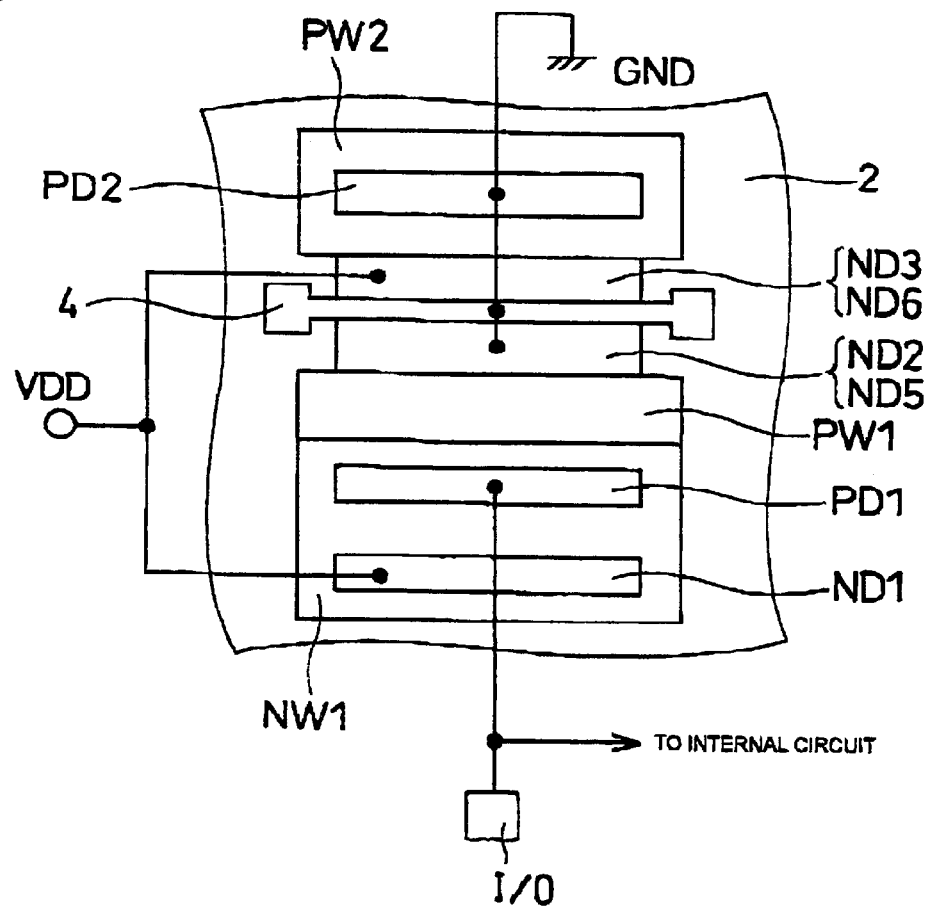
FIG. 5B is a plan view thereof.

In the present embodiment, as shown in FIGS. 4, 5A and 5B, a p-type epitaxial layer 2 is deposited on a p-types semiconductor substrate 1, while an N well NW1 (2nd-conductivity type well) is formed on the surface of this p-type epitaxial layer 2. Shallow trench isolation (STI) films STI1–ST3 for electrical isolation between devices are formed in the center and both ends of the N well NW1. An n+ diffusion layer ND1 (first 2nd-conductivity type diffusion layer) is formed in the region between STI1 and STI2 on the surface of the N well NW1, while a p+ diffusion layer PD1 (first 1st-conductivity type diffusion layer) is formed in the region between STI2 and STI3. Silicide layers S1 and S2 are formed on the n+ diffusion layer ND1 and p+ diffusion layer PD1, respectively.

A P well PW1 is formed adjacent to the N well NW1 under the device isolation film STI3, while another P well PW2 is formed apart from the STI3 on the surface of the p-type epitaxial layer 2. Device isolation film STI4 and STI5 are formed of shallow trench isolation (STI) films in both ends of the P well PW2. A p+ diffusion layer PD2 is formed in the region between STI4 and STI5, while an n-channel MOS transistor NMOS with the extension structure is formed in the region between STI3 and STI4. In other words, the n+ diffusion layers ND2 and ND3 are formed adjacent to the device isolation films STI3 and STI4, respectively, while the n-type diffusion layers ND5 and ND6 are formed adjacent to those ND2 and ND3, respectively, Silicide layers S3 and S4 are formed on the n+ diffusion layers ND2 and ND3, respectively, while a gate dielectric film 3 and a gate electrode 4 are deposited on the channel region between the n-type diffusion layers ND5 and ND6. The channel is 0.2 $\mu$m in length, for example. Side-walls 5 are formed on the sides of the gate electrode 4, and a silicide layer S6 is formed on the gate electrode 4. A silicide, layer 35 is formed on the p+ diffusion layer PD2. The silicide layers S1–S6 are made of cobalt silicide or titanium silicide, for example.

An interlayer dielectric film (not shown) is deposited over the whole surface, and a power supply voltage VDD, for example, 1.5V, is supplied in the normal operation to the silicide layers S1 and S4 via contact holes formed in the interlayer dielectric film. Namely, the silicide layers S1 and S4 are connected with a metallic wire M1. The silicide layers S3, S5 and S6 are connected to the ground terminal GND, while the silicide layer S2 is connected to the input/output pad I/O. The input/output pad I/O is connected to the internal circuit (the circuit to be protected). In other words, the input/output pad I/O is connected to the MOS transistor NMOS working as a trigger device via the p+ diffusion layer PD1, N well NW1, n+ diffusion layer ND1 and metallic wire M1. The metallic wire is made of a pure metal or an alloy. For example, the metallic wire is made of aluminum (Al) or copper (Cu).

Referring now to FIG. 5A, the ESD protection circuit according to the present embodiment of the above configuration has a transistor Tr1 comprising the p+ diffusion layer PD1, N well NW1, P well PW1 and p-type epitaxial layer 2 as well as a transistor Tr2 comprising the N well NW1, P well PW1, p-type epitaxial layer 2 and n+ diffusion layer ND2 Namely, the p+ diffusion layer PD1, N well NW1, P well PW1, p-type epitaxial layer 2 and n+ diffusion layer ND2 constitute a SCR. Resistances Rnw and Rpw parasitize the N well NW1 and P well PW2, respectively.

Referring now to FIGS. 4, 5A and 5B, the operation of the device according to the first embodiment is explained below. When a positive ESD surge against the ground terminal GND is loaded on the input/output pad I/O, a breakdown occurs between the drain diffusion layers (n+ diffusion layer ND3 and n-type diffusion layer ND6) and the channel (p-type epitaxial layer 2) of the MOS transistor NMOS. As a result, a trigger current Itrig flows in a path comprising the p+ diffusion layer PD1, N well NW1, n+ diffusion layer ND1, drain diffusion layers (n+ diffusion layer ND3 and n-type diffusion layer ND6) and channel (p-type epitaxial layer 2). The trigger current Itrig for mns a current path between an emitter and a base of the P-N-P transistor consists of the p+ diffusion layer PD1, N well Nw1 and P well PW1. Then the P-N-P transistor turns on while a breakdown occurs at MOS transistor NMOS, as a trigger device. When the P-N-P transistor turns on, the N-P-N transistor turns on. As the result, the parasitic SCR, which comprises the p+ diffusion layer PD1, N well NW1, P well PW1 and p-type epitaxial layer 2, n+ diffusion layer ND2, is activated. At the moment, a large current Iscr flows from the input/output pad I/O to the ground terminal GND. The surge loaded on the input/output pad I/O is thereby released to the ground terminal GND without damage to the internal circuit.

In the first embodiment, the parasitic capacitance within the ESD protection circuit exists only in the boundary area between the p+ diffusion layer PD1 and the N well NW1. The area of this boundary, however, is very small. Thus high-speed operation on the order of a few giga-bps can be realized. Besides, since the MOS transistor NMOS is connected to the n+ diffusion layer ND1 with the metallic wire M1, the MOS transistor NMOS can be located in a desired position. Then the distance between the p+ diffusion layer PD1 and the P well PW1 where current Iscr runs can be made shorter than the depth of the N well NW1. Namely, distance Lscr, which is typically 2–3 $\mu$m in the prior art, can be shortened to about 0.6 $\mu$m. Thus the SCR shows a good ESD performance with sell size thereof.

Next, the manufacturing method for the ESD protection circuit according to the first embodiment is described below. FIGS. 6A–6C and FIGS. 7A–7B are sectional views of the device in accordance with the first embodiment at each manufacturing step.

Figure 6A:
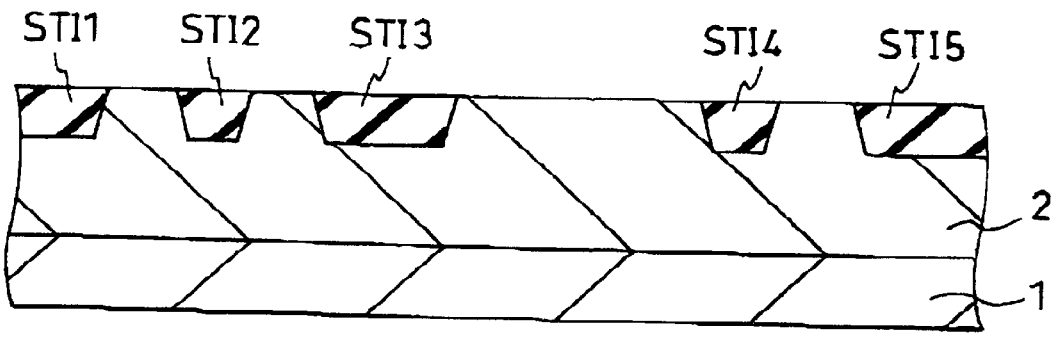
FIGS. 6A–6C are sectional views of the ESD protection circuit according to the first embodiment at the respective manufacturing steps.

First, as shown in FIG. 6A, device isolation films STI1–STI5 are formed selectively on the surface of a p-type semiconductor substrate 1 where a p-type epitaxial layer 2 has been deposited in advance.

Figure 6B:
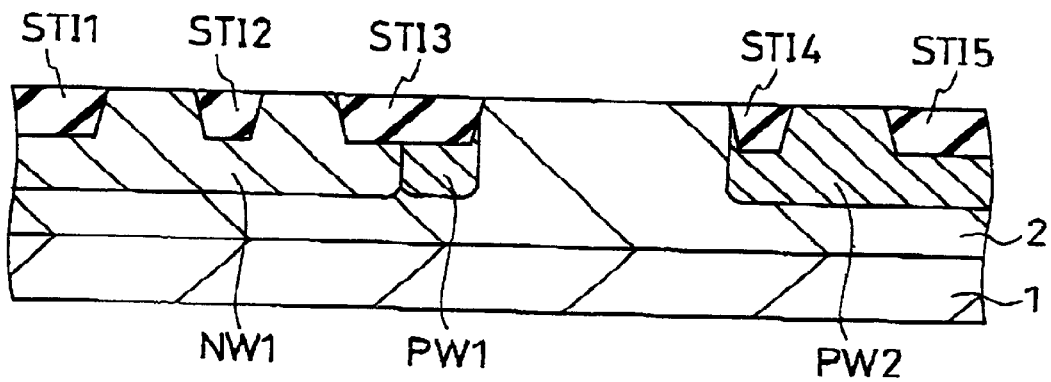

Next as shown in FIG. 6B, an N well NW1 extending from beneath the center of the device isolation film STI3 to beneath the STI1, a P well PW1 extending beneath the STI3 opposite to the N well NW1 but not exceeding the end of the STI3, and a P well PW2 extending from beneath the device isolation film STI4 to STI5 are selectively formed by ion implantation. The impurity concentrations in the N well NW1 and P well PW1 are about $5\times10^{17}/cm^8$, for example.

Figure 6C:
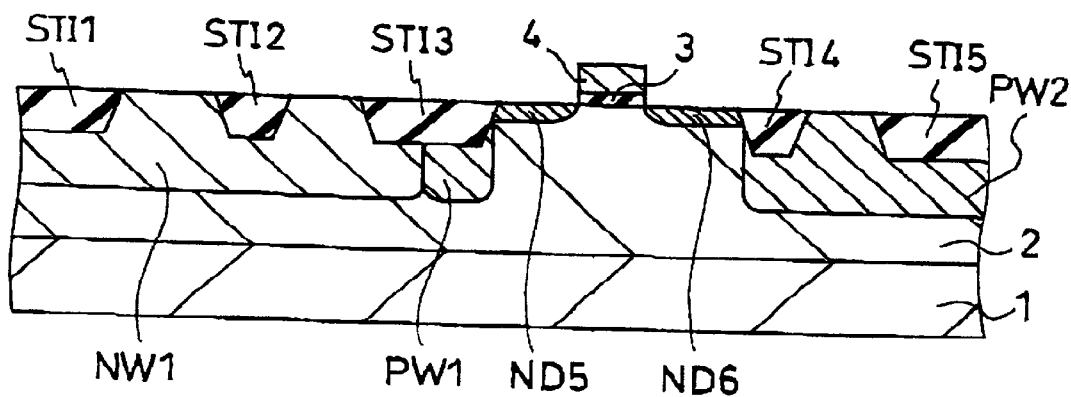

Then as shown in FIG. 6C, a gate dielectric film 3 and a gate electrode 4 are selectively deposited in the device formation region between the STI3 and STI4. Subsequently, n-type diffusion layers ND5 and ND6 are formed in the device formation region by ion plantation using the gate electrode 4 and the gate dielectric film 3 as masks. In this ion implantation, for example, arsenic ions are implanted at a dose rate of $5\times10^{14}/cm^2$ at acceleration energy of 5 kev.

Figure 7A:
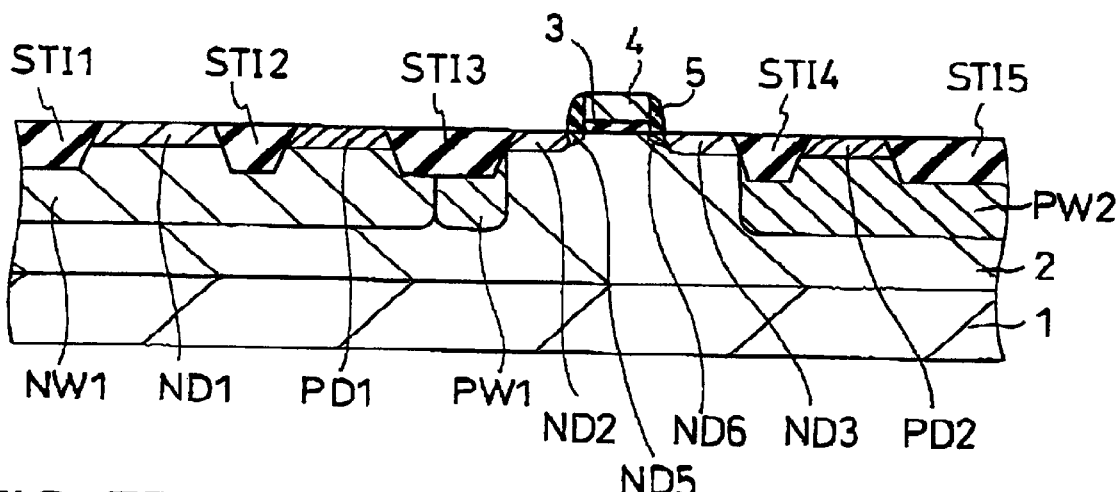
FIGS. 7A, 7B are sectional views of the ESD protection circuit according to the first embodiment at the manufacturing steps following those described in FIGS. 6A–6C.

In the next step, as shown in FIG. 7A, an n+ diffusion layer ND1 between the device isolation film STI1 and STI2, a p+ diffusion layer PD1 between the STI2 and STI3, and a p+ diffusion layer PD2 between the STI4 and STI5 are formed by ion Plantation. When forming the n+ diffusion layer ND1, for example, arsenic ions are implanted at a dose rate of $5\times10^{15}/cm^2$ at acceleration energy of 10 keV, while boron ions, for example, are planted at a dose rate of $5\times10^{18}/cm^2$ at an acceleration energy of 5 keV for the formation of the p+ diffusion layers PD1 and PD2.

Figure 7B:
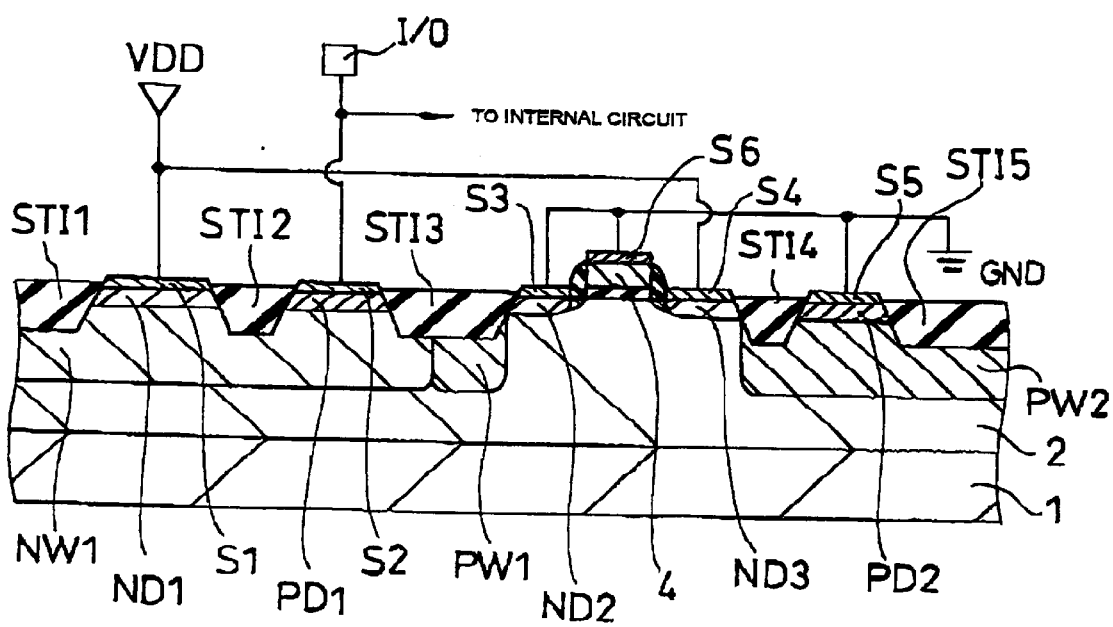

Next as shown in FIG. 7B, a cobalt silicide film S1 is formed on the n+ diffusion layer ND1, a cobalt silicide film S2 on the p+ diffusion layer PD1, a cobalt silicide film S3 on the n+ diffusion layer ND2, a cobalt silicide film S4 on the n+ diffusion layer ND3, a cobalt silicide film S5 on the p+ diffusion layer PD2, and a cobalt silicide film S6 on the gate electrode 4. Then an interlayer dielectric film (not shown) is formed over the whole surface; contact holes are formed in this dielectric film; and wires are formed. Thereby, the input/output pad I/O is connected to the cobalt silicide film S2; a power supply voltage terminal VDD that supplies 1.5V, for example, is connected to cobalt silicide films S1 and S4; and the ground terminal GND is connected to the cobalt silicide films S3, S5 and S6. The ESD protection circuit in accordance with the first embodiment is thereby fabricated.

Figure 8A:
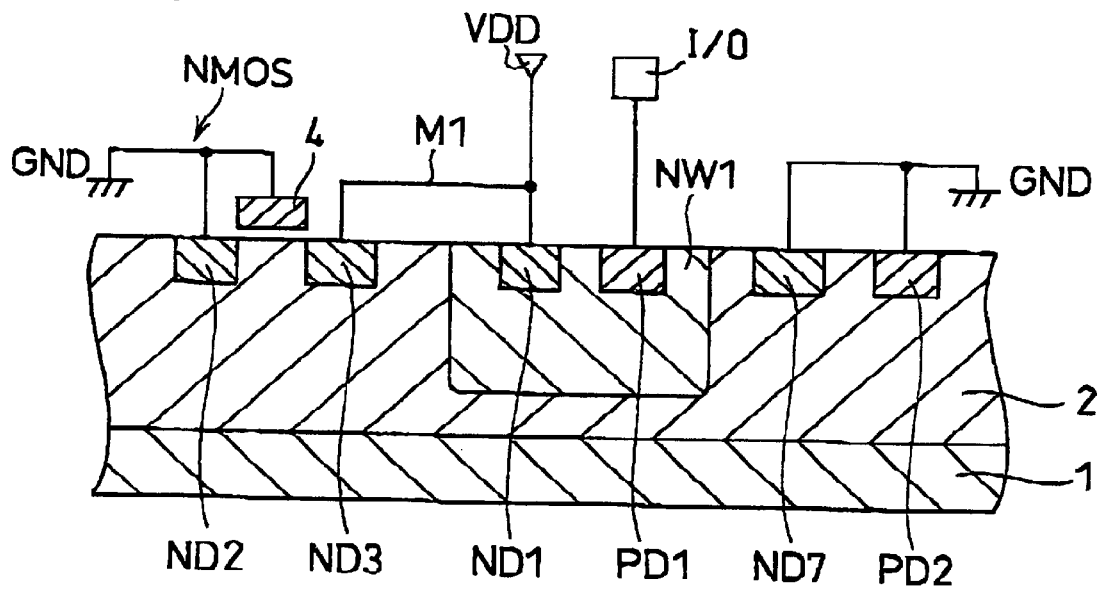
FIG. 8A is a sectional view illustrating the structure of an ESD protection circuit according to a second embodiment of the present invention.
Figure 8B:
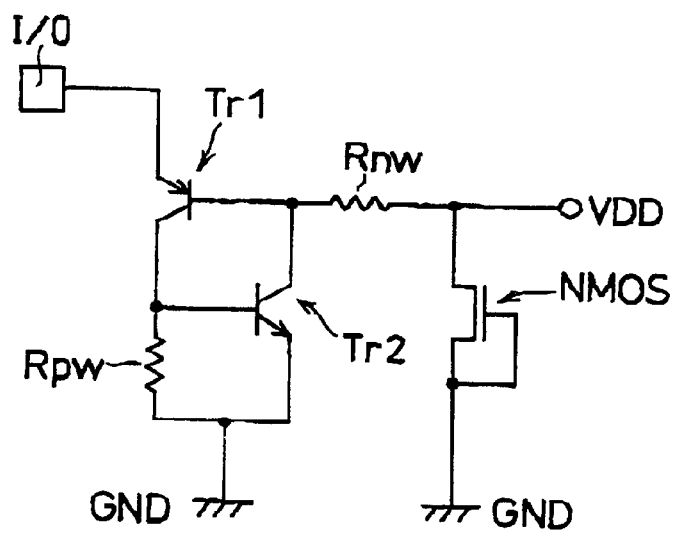
FIG. 8B is an equivalent circuit diagram thereof.

Next, a second embodiment of the present invention will be described below. FIG. 8A is a sectional view illustrating the structure of the ESD protection circuit in accordance with the present embodiment; and FIG. 8B is its equivalent circuit diagram. In FIG. 8A, however, device isolation films, silicide layers, gate dielectric films and side-walls, which have been referred to in FIG. 4, are not shown again.

In this embodiment, referring now to FIGS. 8A and 8B, a p-type epitaxial layer 2 is deposited on the p-type semiconductor substrate 1, and an N well NW1 is formed on its surface. Device isolation films (not shown) are formed in the center and both ends of the N well NW1. An n+ diffusion layer ND1 and p+ diffusion layer PD1 are formed on the surface of the N well NW1 in the region on the epitaxial layer 2, separated by the device isolation films.

In the outside of the N well M1 on the surface of the p-type epitaxial layer 2, an n+ diffusion layer ND3 is forward to sandwich the n+ diffusion layer ND1 with the p+ diffusion layer PD1, while an n+ diffusion layer ND2 is formed to sandwich the n+ diffusion layer ND3 with the n+ diffusion layer ND1. The n+ diffusion layers ND2 and ND3 work as the source diffusion layer and the drain diffusion layer, respectively, of the MOS transistor NMOS. The region between the n+ diffusion layers ND2 and ND3 works as the channel. The channel length is 0.2 $\mu$m, for example. A gate dielectric film (not shown) is formed on this channel region, and a gate electrode 4 is formed on this gate dielectric film.

Meanwhile, in the outside of the N well NW1 on the surface of the p-type epitaxial layer 2, an n+ diffusion layer ND7 is formed to sandwich the p+ diffusion layer PD1 with the n+ diffusion layer ND1, while a p+ diffusion layer PD2 is formed to sandwich the n+ diffusion layer ND7 along with the p+ diffusion layer PD1. A silicide layer (not shown) is formed on each of the n+ diffusion layers ND1, ND2, ND3 and ND7 as well as the p+ diffusion layers PD1 and PD2.

An interlayer dielectric film (not shown) is formed on the whole surface, and the power supply voltage terminal VDD is connected to the n+ diffusion layers ND1 and ND3 via contact holes formed in this interlayer dielectric film. The n+ diffusion layer ND1 is connected to the n+ diffusion layer ND3 with a metallic wire M1. The ground terminal GND is connected to the ND3 gate electrode 4, n+ diffusion layer ND2, n+ diffusion layer ND7 and p+ diffusion layer PD2. The input/output pad I/O is connected to the p+ diffusion layer PD1. The input/output pad I/O is connected to the internal circuit (the circuit to be protected). P wells may be formed in part of the surface of the p-type epitaxial layer 2 excluding the region for the N well NW1.

Referring now to FIG. 8B, the ESD protection circuit according to the present embodiment has a transistor Tr1 comprising the p+ diffusion layer PD1, N well NW1, and p-type epitaxial layer 2, while the N well NW1, p-type epitaxial layer 2 and n+ diffusion layer ND7 constitute a transistor Tr2. Namely, the p+ diffusion layer PD1, N well NW1, p-type epitaxial layer 2 and n+ diffusion layer ND7 constitute a SCR. resistances Rnw and Rpw parasitize the N well NW1 and p-type epitaxial layer 2, respectively.

Referring now to FIGS. 8A and 8B, the operation of the device according to the second embodiment is explained below. When a positive ESD surge against the ground terminal GND is loaded on the input/output pad I/O, a breakdown occurs between the drain diffusion layer (n+ diffusion layer ND3) of the MOS transistor NMOS and the channel (p-type epitaxial layer 2). As a result, a trigger current Itrig flows in the path comprising the p+ diffusion layer PD1, N well NW1, n+ diffusion layer ND1, metallic wire M1, drain diffusion layer (n+ diffusion layer ND3) and channel (p-type epitaxial layer 2). The trigger current Itrig forms a current path between an emitter and a base of the P-N-P transistor consist of the p+ diffusion layer PD1, N well NW1 and p-type epitaxial layer 2. Then the P-N-P transistor turns on while a breakdown occurs at MOS transistor NMOS, as a trigger device. When the P-N-P transistor turns on, the N-P-N transistor, consists of N well NW1, p-type epitaxial layer 2 and n+ diffusion layer ND7, turns on. Then, the parasitic SCR, which comprises the p+ diffusion layer PD1, N well NW1, p-type epitaxial layer 2 and n+ diffusion layer ND7, is activated. A large current Iscr flows from the input/output pad I/O to the ground terminal GND. The, surge loaded on the input/output pad I/O is thereby released to the ground terminal without application of stress to the internal circuit.

Contrasted with the first embodiment, this embodiment doesn't constraint the MOS transistor NMOS location, because the source of the MOS transistor NMOS (n+ diffusion layer ND2) and the cathode of the SCR (n+ diffusion layer ND7) are not common.

Figure 9A:
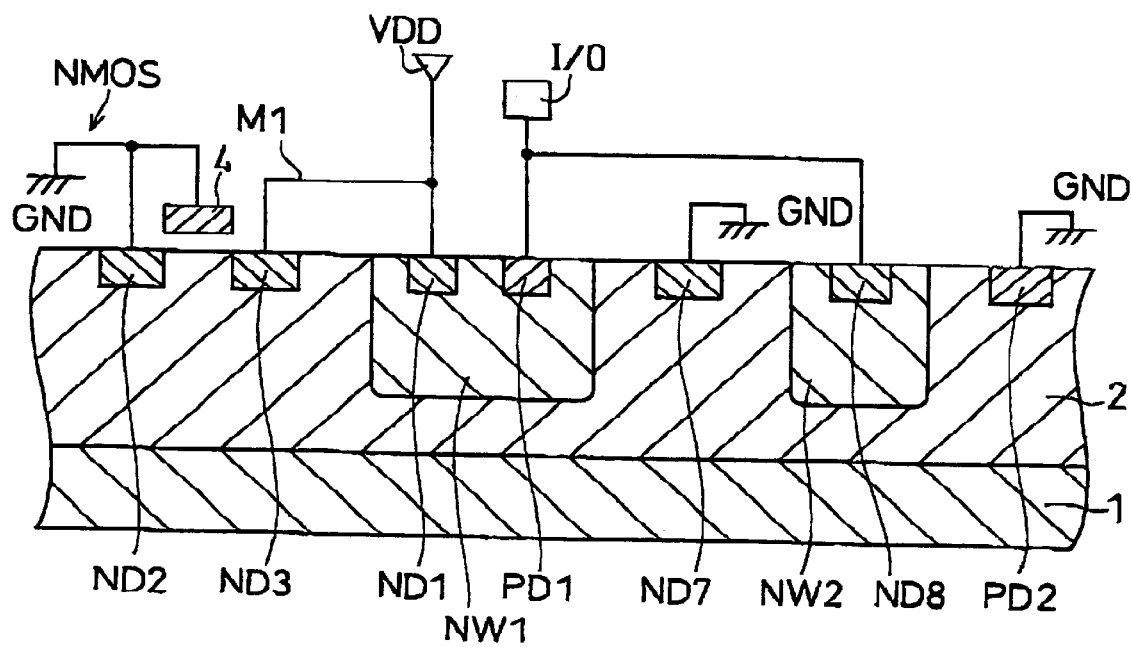
FIG. 9A is a sectional view illustrating the structure of an ESD protection circuit according to a third embodiment of the present invention.
Figure 9B:
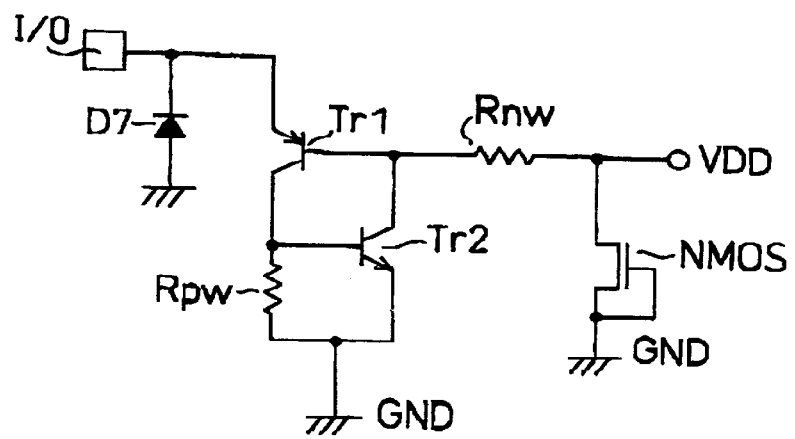
FIG. 9B is an equivalent circuit diagram thereof.

Next, a third embodiment of the present invention is described below. FIG. 9A is a sectional view illustrating the structure of the ESD protection circuit in accordance with the present embodiment; and FIG. 9B is its equivalent circuit diagram. In FIG. 9A as well as FIG. 8A, however, device isolation films, silicide layers, gate dielectric films and side-walls, which have been drawn in FIG. 4, are not shown again.

Referring now to FIGS. 9A and 9B in this embodiment, compared with the second embodiment, an N well NW2 is formed between the n+ diffusion layer ND7 and the p+ diffusion layer PD2 on the p-type epitaxial layer 2, and an n+ diffusion layer ND8 is formed on the surface of this N well NW2. A silicide layer (not shown) is formed on the surface of the n+ diffusion layer ND8, and this silicide layer is connected to the input/output pad I/O. Namely, the input/output pad I/O is connected to the n+ diffusion layer ND8 as well as to the p+ diffusion layer PD1 and internal circuit (not shown). The p+ diffusion layer PD2, p-type epitaxial layer 2, N well NW2 and n+ diffusion layer ND8 constitute a P-N junction diode D7. The other configurations of this embodiment are the same as those of the second embodiment.

Referring now to FIGS. 9A and 9B, the operation of the device according to the third embodiment is explained below. When a positive ESD surge against the ground terminal GND is loaded on the input/output pad I/O, the ESD surge is released to the grounded terminal GND and the internal circuit is protected in the same manner as described in the second embodiment. When a negative surge against the ground terminal GND is loaded on the input/output pad I/O, the P-N junction diode D7 comprising the p+ diffusion layer PD2, p-type epitaxial layer 2, N well NW2 and n+ diffusion layer ND8 is activated. Then the negative ESD surge is released to the ground terminal GND through this P-N junction diode D7, and the internal circuit is thereby protected from the negative ESD surge.

Compared with the second embodiment, the internal circuit can be protected from negative ESD surge in this embodiment. Besides, the performance of the N-P-N transistor is improved by separating the n+ diffusion layer ND7, which is the cathode of the SCR, from the p+ diffusion layer PD2, which is the base contact of the N-P-N transistor, locating the N well NW2 between them.

Figure 10A:
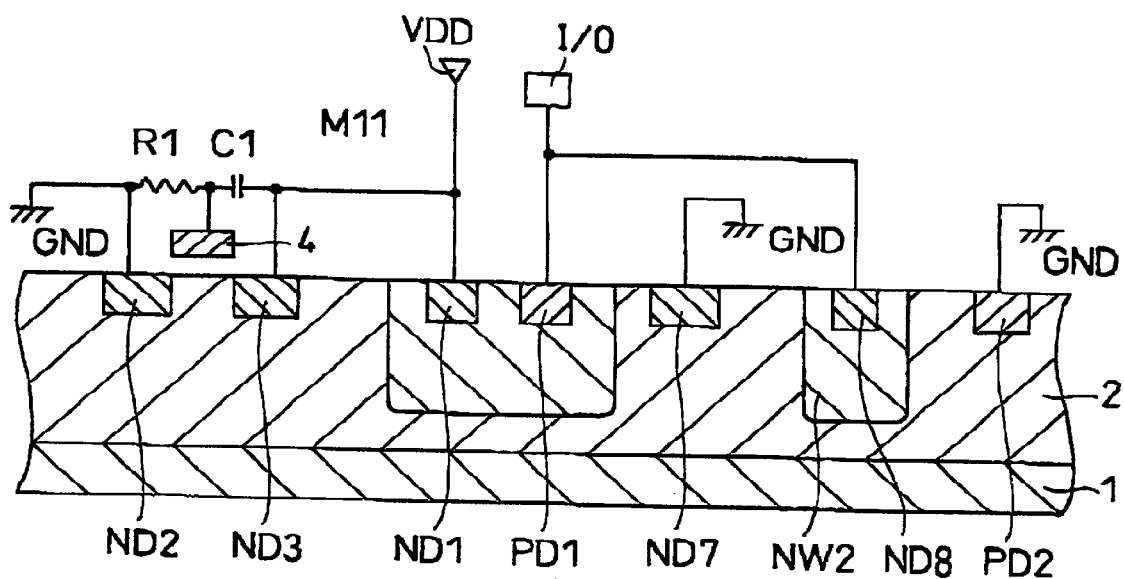
FIG. 10A is a sectional view illustrating the structure of an ESD protection circuit according to a fourth embodiment of the present invention.
Figure 10B:
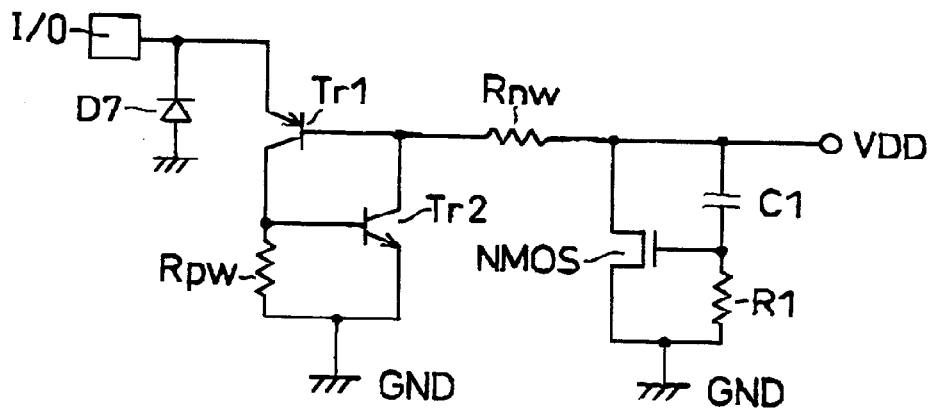
FIG. 10B is an equivalent circuit diagram thereof.

Next, a fourth embodiment of the present invention is described below. FIG. 10A is a sectional view illustrating the structure of the ESD protection circuit in accordance with the present embodiment; and FIG. 10B is its equivalent circuit diagram. In FIG. 10A as well as FIGS. 8A and 9A, however, device isolation films, silicide layers, gate dielectric films and side-walls, which have been drawn in FIG. 4, are not shown again.

Referring now to FIGS. 10A and 10B in this embodiment, compared with the third embodiment, a resistance R1 is inserted between the n+ diffusion layer ND2 and the gate electrode 4, and a capacitor C1 is inserted between the n+ diffusion layer ND3 and the gate electrode 4. Namely, a resistance and a capacitor are connected between the source region and the gate electrode, and between the drain region and the gate electrode, respectively, in the MOS transistor NMOS. The other configurations of the present embodiment are the same as those of the third embodiment.

In this embodiment, compared with the third embodiment, the breakdown voltage of the NOS transistor NMOS can be lowered because of capacity coupling effect between gate and drain. Then the trigger voltage Vtrig of the SCR can be lowered and the internal circuit is protected with higher reliability.

Figure 11A:
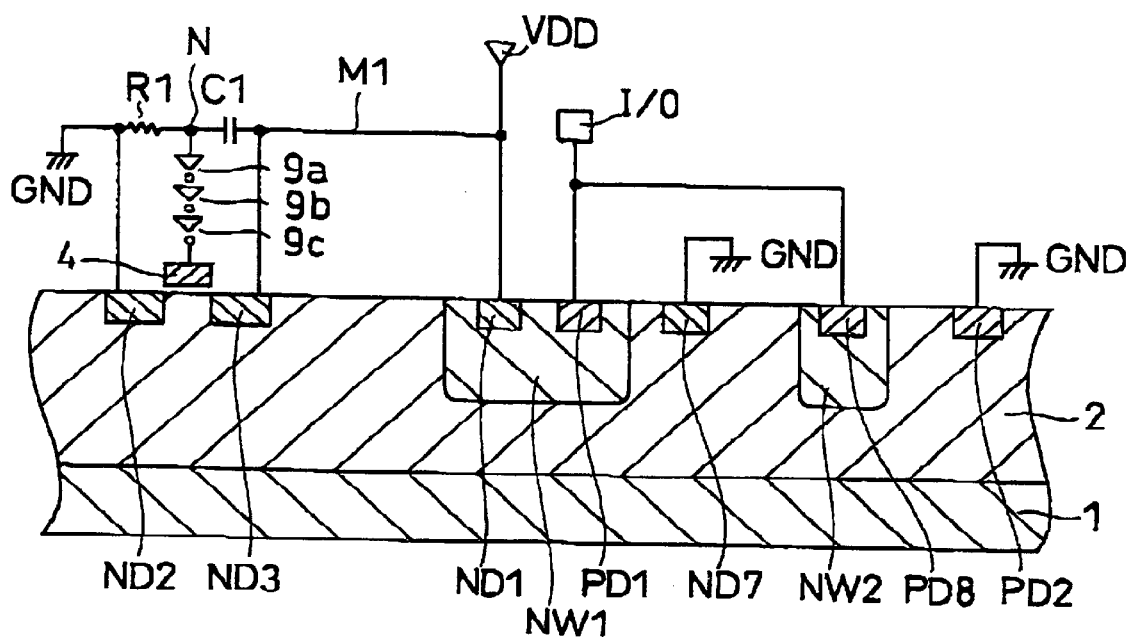
FIG. 11A is a sectional view illustrating the structure of an ESD protection circuit according to a fifth embodiment of the present invention.
Figure 11B:
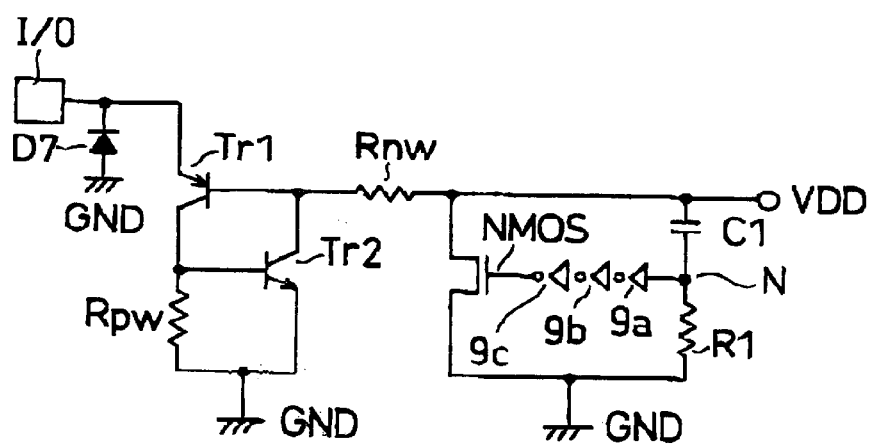
FIG. 11B is an equivalent circuit diagram thereof.

Next, a fifth embodiment of the present invention is described below. FIG. 11A is a sectional view illustrating the structure of the ESD protection circuit in accordance with the present embodiment; and FIG. 11B is its equivalent circuit diagram. In FIG. 11A, however, device isolation film, silicide layers, gate dielectric films and side-walls are not shown.

Referring now to FIGS. 11A and 11B in this embodiment, compared with the fourth embodiment, three inverters 9a, 9b, and 9c are serially inserted between the gate electrode 4 and a node N sandwiched by the resistance R1 and the capacitor C1. The other configurations of the present embodiment are the same as those of the fourth embodiment.

In the fifth embodiment, similarly the fourth embodiment, the breakdown voltage of the MOS transistor NMOS can be lowered, and the trigger voltage Vtrig can be lowered. Still, in this embodiment, an add number of inverters 9a, 9b and 9c are cascade connected each other. But, the circuit consists of inverters 9a, 9b and 9c can be replaced with a delay circuit that delays a signal input the node sandwiched by the resistance R1 and the capacitor C1.

Figure 12A:
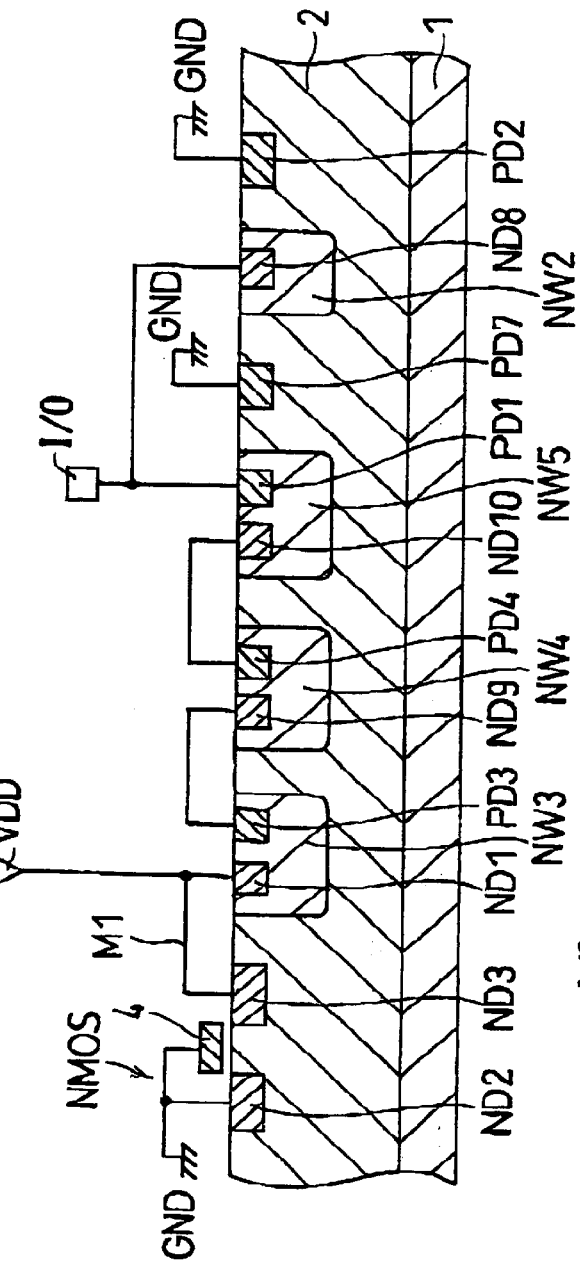
FIG. 12A is a sectional view illustrating the structure of an ESD protection circuit according to a sixth embodiment of the present invention.
Figure 12B:
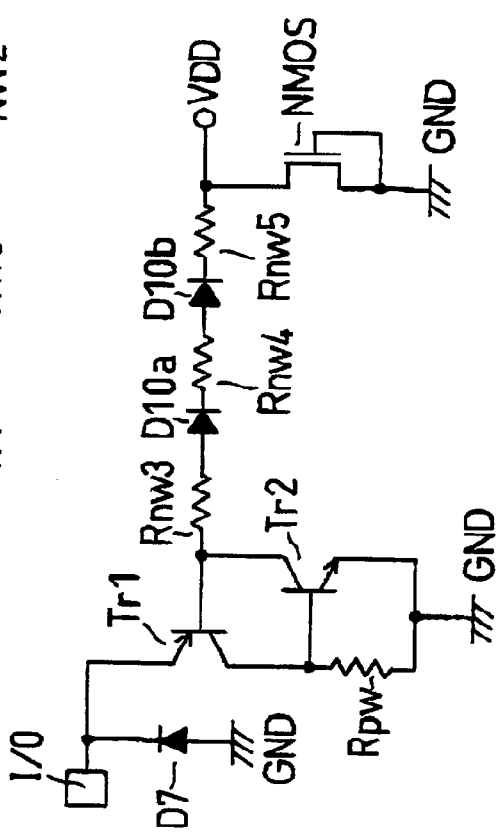
FIG. 12B is an equivalent circuit diagram thereof.

Next, a sixth embodiment of the present invention is described below. FIG. 12A is a sectional view illustrating the structure of the ESD protection circuit in accordance with the present embodiment, and FIG. 12B is its equivalent circuit diagram. In FIG. 12A, however, device isolation film, silicide layers, gate dielectric films and side-walls are not shown.

Referring now to FIGS. 12A and 12D in this embodiment, compared with the third embodiment, the N well NW1 in the third embodiment (see FIG. 9A) is separated into three N wells, NW3, NW4 and NW5 aligned in a direction. An n+ diffusion layer ND1 and a p+ diffusion layer PD3 are ford on the surface of the N well NW3, an n+ diffusion layer ND9 and a p+ diffusion layer PD4 are formed on the surface of the N well NW4, and an n+ diffusion layer ND10 and a p+ diffusion layer PD1 are formed on the surface of the N well NW5. The n+ diffusion layer ND1, p+ diffusion layer PD3, n+ diffusion layer ND9, p+ diffusion layer PD4, n+ diffusion layer ND10 and p+ diffusion layer PD1 are aligned in this order. The p+ diffusion layer PD3 is connected to the n+ diffusion layer ND9, while the p+ diffusion layer PD4 is connected to n+ diffusion layer ND10. In this embodiment, the p+ diffusion layer PD4 and the N well NW4 constitute a P-N junction diode D10a, while the p+ diffusion layer PD3 and the N well NW3 constitute a P-N junction diode D10b. These P-N junction diodes D10a and D10b limit current to the direction from the input/output pad I/O to the power supply terminal VDD. Resistances Rnw3, Rnw4 and Rnw 5 parasite in the N wells NW3, NW4 and NW5, respectively. The other configurations of the present embodiment are the same as those of the third embodiment.

Compared with the third embodiment, this embodiment has a plurality of diodes between the input/output pad I/O and the power supply terminal VDD. Thus, when the power supply voltage falls to the ground potential, if the voltage of a signal input to the input/output pad I/O is lower than the level of these diodes turn-on, no current flows from the input/output pad I/O to the power supply terminal VDD and malfunction of the internal circuit can be prevented. Namely, a fail-safe function is realized. Still, the number of the diodes must be selected according to the voltage level of the signal.

Next, a seventh embodiment of the present invention is described below. This embodiment is a combination of the sixth and fourth embodiments. Compared with the sixth embodiment shown in FIG. 12A, this embodiment has a resistance between the n+ diffusion layer ND2 and the gate electrode 4 and has a capacitor between the n+ diffusion layer ND3 and the gate electrode 4. Namely, a resistance and a capacitor are inserted between the gate electrode 4 and the source region and between the gate electrode 4 and the drain region, respectively, in the MOS transistor NMOS. The other configurations of the present embodiment are the same as these of the third embodiment.

Compared with the sixth embodiment, this embodiment can lower the breakdown voltage of the MOS transistor NMOS because of capacity coupling effect between gate and drain. Then the trigger voltage Vtrig of the SCR can also be lowered and the internal circuit is protected with higher reliability.

Next, an eighth embodiment of the present invention is described below. This embodiment is a combination of the sixth and fifth embodiments. Compared with the seventh embodiment, this embodiment has serially connected three inverters between the gate electrode 4 and the node between the resistance and the capacitor. The other configurations of the present embodiment are the same as those of the seventh embodiment.

Next, a ninth embodiment of the present invention is described below. This embodiment differs from the third embodiment in that the N well NW1 is not connected to the power supply voltage terminal VDD. The other configurations of the present embodiment are the same as those of the third embodiment. This embodiment prevents the destruction of the MOS transistor NMOS due to an ESD surge between the power supply voltage terminal VDD and the ground terminal GND. Then the MOS transistor NMOS can be downsized in this embodiment as well as the fourth embodiment, a resistance and a capacitor may be inserted between the gate electrode 4 and the source region and between the gate electrode 4 and the drain region, respectively, in the MOS transistor NMOS. Besides, as is the case with fifth embodiment, inverters may be inserted between the gate electrode and the node between the resistance and the capacitor.

Next, a tenth embodiment of the present invention is described below. This embodiment is a combination of the sixth and ninth embodiments. This embodiment differs from the sixth embodiment in that the N well NW1 is not connected to the power supply voltage terminal VDD. The other configurations of the present embodiment are the same as those of the sixth embodiment. This embodiment can prevent the destruction of the MOS transistor NMOS due to an ESD surge between the power supply voltage terminal VDD and the ground terminal GND. Then the MOS transistor NMOS can be downsized. In this embodiment as well as the seventh embodiment, a resistance and a capacitor may be inserted between the gate electrode and the source region and between the gate electrode and the drain region, respectively, in the MOS transistor NMOS. Besides, as is the case with eighth embodiment, inverters may be inserted between the gate electrode and the node between the resistance and the capacitor.

Figure 13:
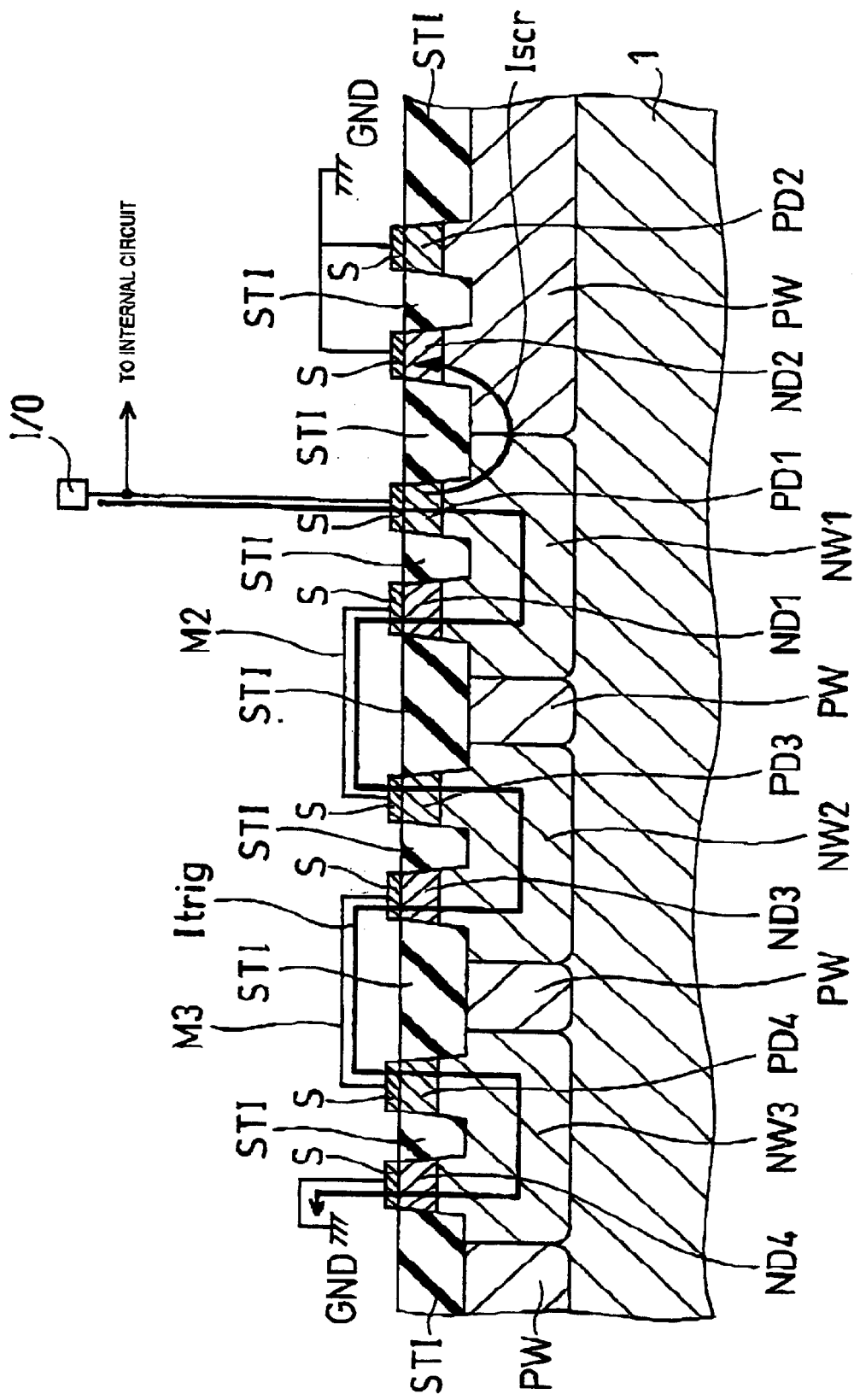
FIG. 13 is a sectional view illustrating the structure of an ESD protection circuit according to an eleventh embodiment of the present invention.
Figure 14A:
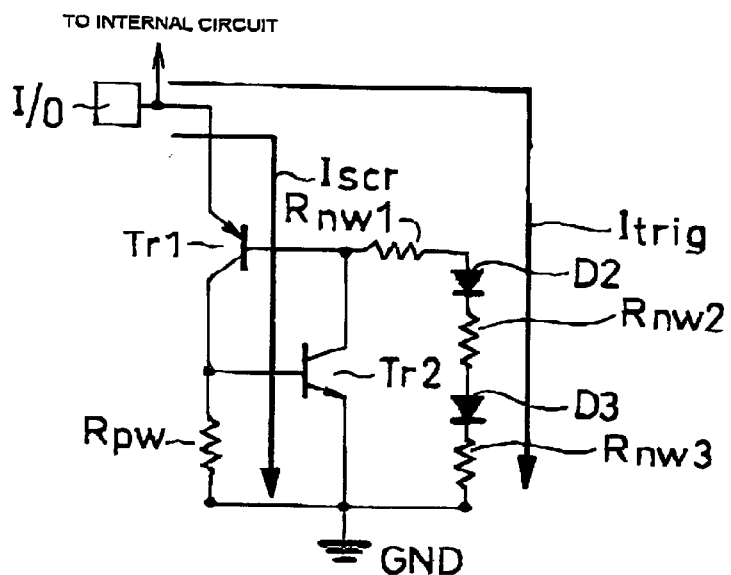
FIG. 14A is an equivalent circuit showing the ESD protection circuit according to the eleventh embodiment.

Next, an eleventh embodiment of the present invention is now described below. FIG. 13 is a sectional view of the ESD protection circuit according to the present embodiment of the invention; FIG. 14A is its equivalent circuit diagram; and FIG. 14B is its layout diagram.

Figure 14B:
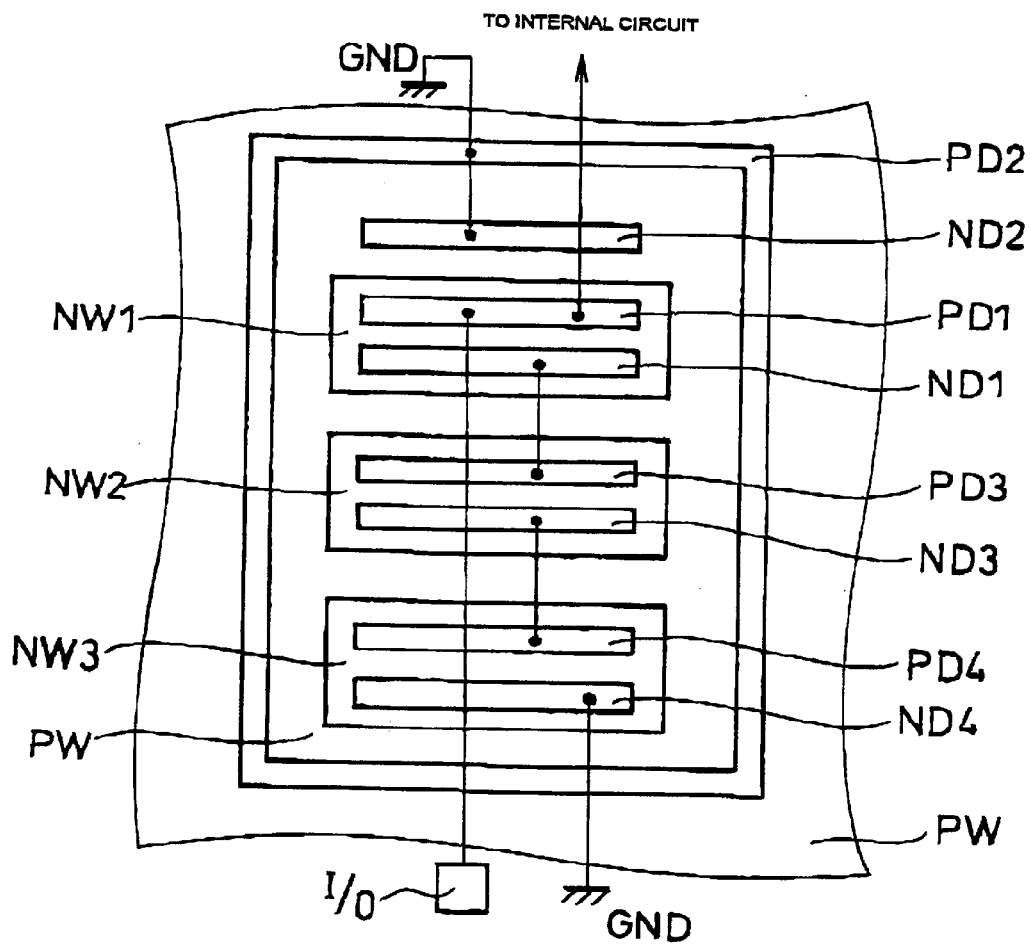
FIG. 14B is a plan view thereof.

In this embodiment, as shown in FIGS. 13 and 14B, N wells (first 2nd-conductivity type wells) NW1, NW2 and NW3 are formed in line, while a P well (1st-conductivity type well) is formed to fill the gaps between these N wells on the surface of the p-type semiconductor substrate 1. The N wells NW1, NW2 and NW3 and the P well PW are approximately the same in depth.

A p+ diffusion layer PD1 (first 1st-conductivity type diffusion layer) and an n+ diffusion layer ND1 (first 2nd-type conductivity diffusion layer) are formed on the surface of the N well NW1; a p+ diffusions layer PD3 and an n+ diffusion layer ND3 are formed on the surface of the N well NW2; and a p+ diffusion layer PD4 and an n+ diffusion layer ND4 are formed on the surface of the N well NW3. The p+ diffusion layer PD1, n+ diffusion layer ND1, p+ diffusion layer PD3, n+ diffusion layer ND3, p+ diffusion layer PD4 and n+ diffusion layer ND4 are aligned in this order following the direction that the N wells NW1, NW2 and NW3 are aligned. Further on the surface of the P well PW, an n+ diffusion layer ND2 (second 2nd-conductivity type diffusion layer) is formed to sandwich the p+ diffusion layer PD1 with the n+ diffusion layer ND1, while a p+ diffusion layer PD2 is formed to surround the n+ diffusion layer ND2 and the N wells NW1–NW3 on the surface of the P well PW. Namely, as shown in FIG. 14B, the p+ diffusion layer PD2 has a shape of the rectangle frame. The n+ diffusion layer ND2 is located in a region between the N well NW1 and the p+ diffusion layer PD2. STI (shallow trench isolation) films are formed in the regions where no diffusion layer of the respective wells is formed, and silicide layers S made of $CoSi_4$, or $TiSi_2$, for example, are formed on the individual diffusion layers.

An interlayer dielectric film (not shown) is deposited on the whole surface. The n+ diffusion layer ND4, n+ diffusion layer ND2 and p+ diffusion layer PD2 are connected to the ground terminal GND, the p+ diffusion layer PD1 is connected to the input/output pad I/O; the n+ diffusion layer ND1 is connected to the p+ diffusion layer PD3 with a metallic wire M2; and the n+ diffusion layer ND3 is connected to the p+ diffusion layer PD4 with a metallic wire M3, all via contact holes formed in the silicide layers of this interlayer dielectric film. The input/output pad I/O is connected to the internal circuit (the circuit to be protected).

In the present embodiment of the above configuration, as shown in FIG. 14A, the p+ diffusion layer PD3, N well NW2 and n+ diffusion layer ND3 constitute a P-N junction diode D2, and the p+ diffusion layer PD4, N well NW3 and n+ diffusion layer ND4 constitute another P-N junction diode D3. The diodes D2 and D3 constitute a trigger device. The p+ diffusion layer PD1, N well NW1 and P well PW constitute a P-N-P transistor Tr1, while the N well NW1, P well PW and n+ diffusion layer ND2 constitute an N-P-N transistor Tr2. Namely, the p+ diffusion layer PD1, N well NW1, P well PW and n+ diffusion layer ND2 constitute a SCR. A resistance Rnw1 parasitizes the N well NW1; resistances Rnw2 and Rnw3 parasitize the N wells NW2 and NW3, respectively; and a resistance Rpw parasitizes the P well PW.

Referring now to FIGS. 13, 14A and 14B, the operation of the device according to the eleventh embodiment is explained below in accordance with the above configuration. When a positive ESD surge against the ground terminal GND is loaded on the input/output pad I/O, a trigger current Itrig flows in the path of two serially connected forward-biased diodes and between an emitter and base comprising the p+ diffusion layer PD1, N well NW1, n+ diffusion layer ND1, metallic wire M2, p+ diffusion layer PD3, N well NW2, n+ diffusion layer ND3, metallic wire M3, p+ diffusion layer PD4, N well NW3 and n+ diffusion layer ND4. The trigger current Itrig forms a current path between an emitter and a base of the P-N-P transistor consists of the p+ diffusion layer PD1, N well NW1 and P well PW. Then the P-N-P transistor turns on when the diodes D2 and D3, as a trigger device, are conducting when the P-N-P transistor turns on, the N-P-N transistor, consists of N well NW1, P well PW and n+ diffusion layer ND2, turns on. Then, the parasitic SCR, which comprises the p+ diffusion layer PD1, N well NW1, P well PW and n+ diffusion layer ND2, is activated. A large current Iscr flows from the input/output pad I/O to the ground terminal GND. The surge loaded on the input/output pad I/O is thereby released to the ground terminal GND without damage of the internal circuit.

In the eleventh embodiment, since the trigger device comprising the diodes D2,and D3 is connected to the base of the P-N-P transistor Tr1 comprising N well NW1 and n+ diffusion layer ND1 via the metallic wire M2, the trigger device may be formed at a desired position and the distance between the p+ diffusion layer PD1 and the P well PW where the current Iscr runs can be make shorter than the depths of the N well NW1 and P well PW. Then distance Lscr which is 2–3 $\mu$m in the prior art, can be shortened to about 0.64 $\mu$m. As a result, the SCR's discharging capability is improved by this reduction of length Lscr, and eventually a high ESD-performance is attained. The parasitic capacitance of the protection device during the usual operation of the semiconductor integrated circuit (IC) that will be protected becomes equal to the diffusion capacitance between the serially connected p+ diffusion layers and N wells. In this embodiment, the discharge ability of the SCR can be high because the distance Lscr can be shortened. Since an enough ESD-performance can be realized if the area of each p+ diffusion layer may be small, the parasitic capacitance can be lowered. For example, 100 $\mu m^2$ is sufficiently large for the area of each p+ diffusion layer. Then its parasitic capacitance will be 100 fF at most, which is small enough for high speed operations on the order of a few Giga-bps. For example, such high ESD-performance, about 4000 V for HBM (Human Body Model), about 400 V for MM (Machine Model), and at 1000V for CDM (Charged Device Model), are provided.

The trigger voltage can be controlled as desired by changing the characteristics of the trigger device (diodes D2 and D3). As a result, the signal voltage applied to the input/output pad can have a large margin.

Further, since a protection device can be formed without using a MOS transistors no extra manufacturing step is needed for fabricating the protection device in addition to the steps for fabricating the internal circuit. In other words, there is no process needed for making the gate dielectric film of the MOS transistor thicker in the ESD protection circuit, even when the gate oxide film of the MOS transistor is about 19 Å in thickness.

When fabricating the ESD protection circuit in accordance with the eleventh embodiment, the impurity concentrations in the N wells and P wells may be about $5 \times 10^{17}/cm^5$, for example. When forming the n+ diffusion layer, arsenic ions, for example, are implanted at a dose rate of $5 \times 10^{15}/cm^2$ at an acceleration energy of 10 keV, while boron ions, for example, are implanted at a dose rate of $5 \times 10^{15}/cm^2$ at an acceleration energy of 5 kev for the formation of the p+ diffusion layers. The dose rates and elements, however, are not limited to these examples.

The eleventh embodiment has employed two P-N junction diodes between the base of the P-N-P transistor and the ground terminal GND. However, the quantity of diodes may be changed according to the relations between the signal voltage applied to the input/output pad I/O and the voltage decline in the P-N junction diodes during usual operation. For example, if the signal voltage is 1.5V or so, two P-N junction diodes will be sufficient. On the other hand, if the signal voltage is 2.5V or so, around four P-N junction diodes will be needed. In this way, the best quantity of P-N junction diodes is determined with reference to the magnitude of leak current running between the input/output pad I/O and the ground terminal GND during usual operation.

Figure 15:
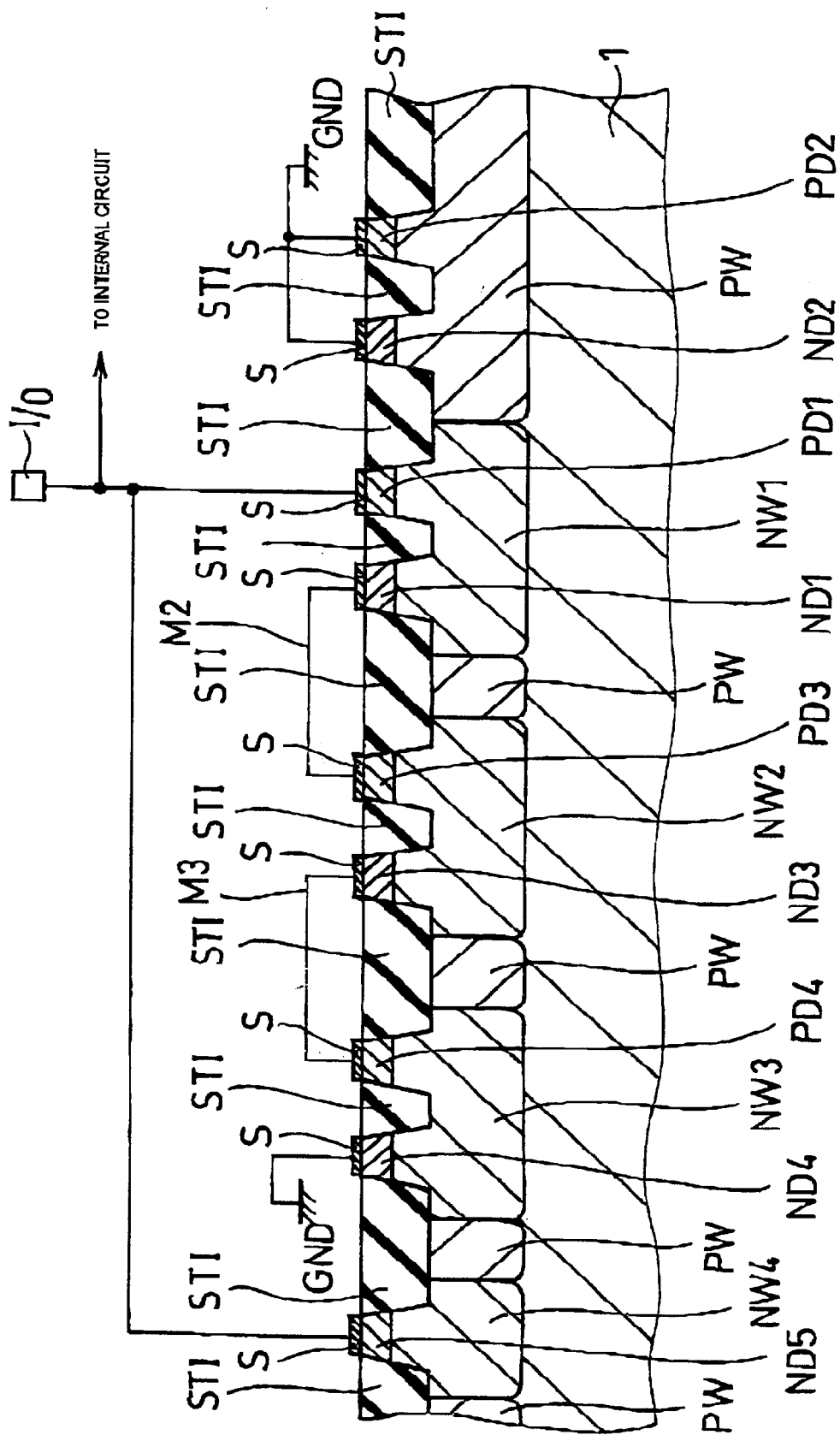
FIG. 15 is a sectional view illustrating the structure of an ESD protection Circuit according to a twelfth embodiment of the present invention.
Figure 16A:
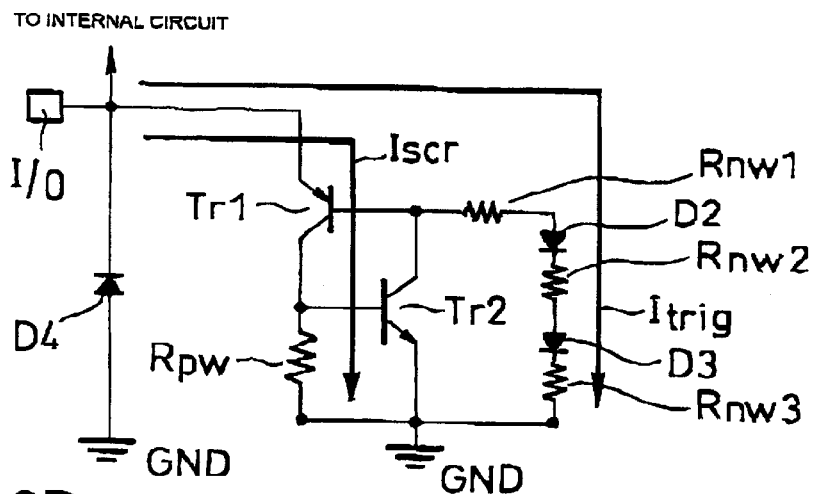
FIG. 16A is an equivalent circuit showing the ESD protection circuit according to the twelfth embodiment.

Next, a twelfth embodiment of the present invention is now described below. FIG. 15 is a sectional view of the ESD protection circuit according to the present embodiment of the invention; FIG. 16A is its equivalent circuit diagram; and FIG. 13B is its layout diagram. The constituting elements common in the eleventh embodiment shown in FIGS. 13 and 14 and the twelfth embodiment shown in FIGS. 15 and 16 have the symbols and their details are not described again here.

Figure 16B:
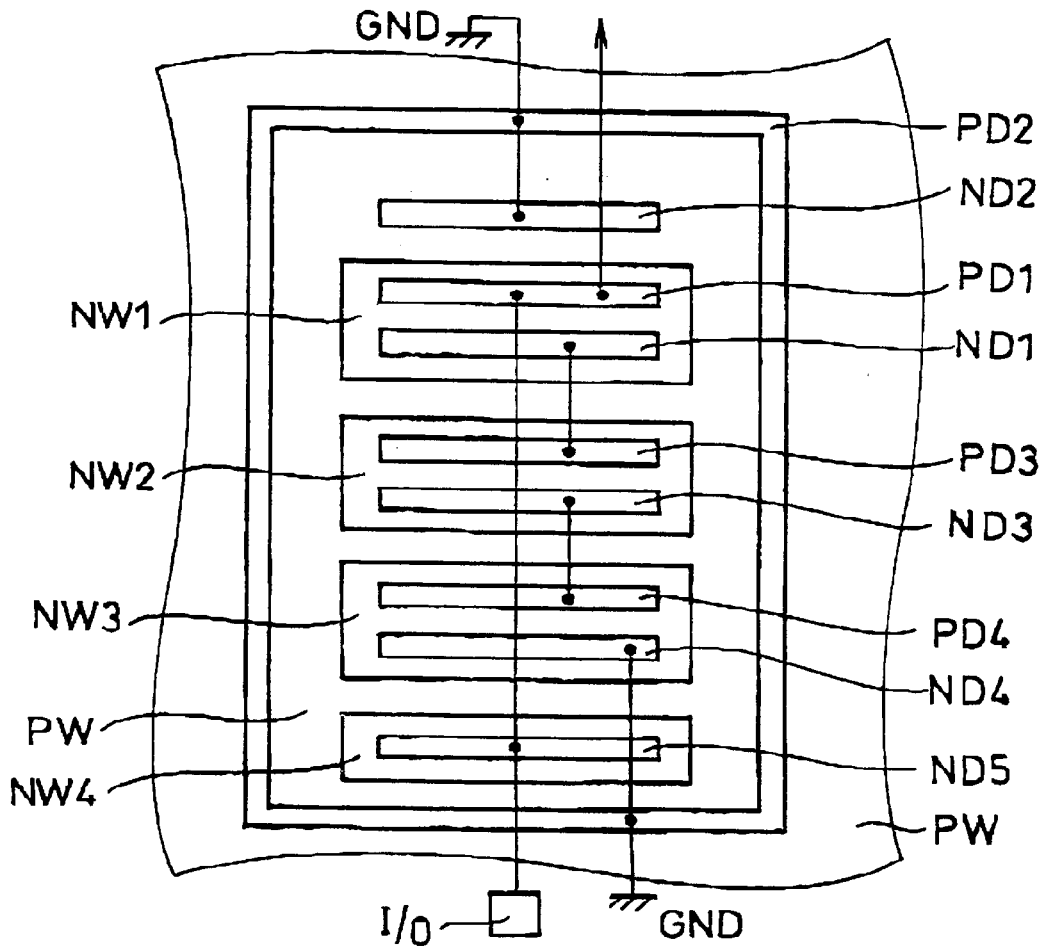
FIG. 16B is a plan view thereof.

In the twelfth embodiment shown in FIGS. 15 and 16B, an N well NW4, which is as deep as the N wells NW1–NW3 and P well PW, is formed so as to sandwich the N well NW3 with the N well NW2 on the surface of the semiconductor substrate 1, and an n+ diffusion layer ND5 is formed on this N well NW4. A silicide layer S is formed on the n+ diffusion layer ND5. The n+ diffusion layer ND5 is connected to the input/output pad I/O via a contact hole formed in the interlayer dielectric film (not shown).

In this embodiment of the above configuration, the p+ diffusion layer PD2, P well PW, p-type semiconductor substrate 1, N well NW4 and n+ diffusion layer ND5 constitute a P-N junction diode D4, as shown in FIG. 16A.

When a positive surge against the ground terminal GND is loaded on the input/output pad I/O, the surge is released to the ground terminal GND, as is the case with the eleventh embodiment. On the other hand, when a negative surge against the ground terminal GND is loaded on the input/output pad I/O, the P-N junction diode D4 is forward-biased and the negative surge is released to the ground terminal GND. Thereby, the internal circuit can be protected from either positive or negative surge.

Figure 17:
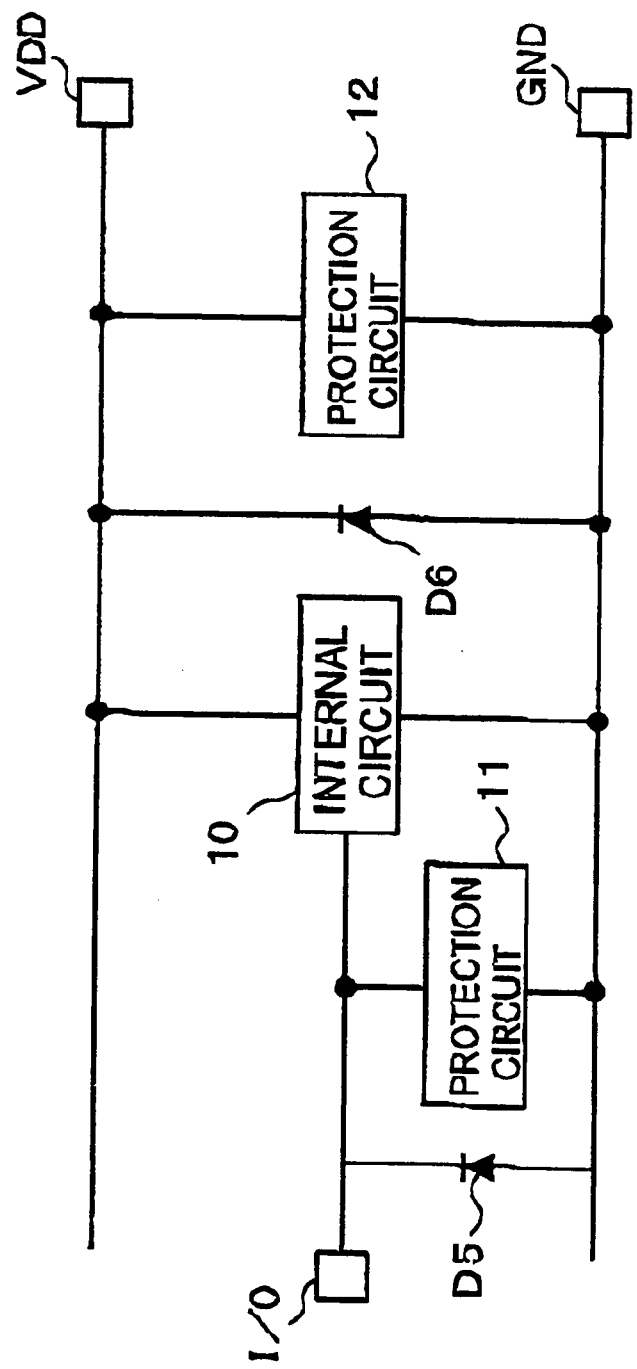
FIG. 17 is an equivalent circuit diagram of an ESD protection circuit according to a thirteenth embodiment of the present invention.

Next, a thirteenth embodiment of the present invention is now described below. FIG. 17 is the equivalent circuit diagram illustrating the structure of the ESD protection circuit in accordance with the present embodiment In the thirteenth embodiment, a P-N junction diode D5 and a protection circuit 11 are connected between the signal line connecting the input/output pad I/O and the internal circuit 10 and the ground line leading to the ground terminal GND. A P-N junction diode D6 and a protection circuit 12 are connected between the power supply line leading to the power supply voltage terminal VDD and the ground line. The internal circuit 10 is connected between the power supply line and the ground line. The structures of the protection circuits 11 and 12 are the same as those of the eleventh embodiment shown in FIG. 14A. Namely, the protection circuits 11 and 12 have P-N junction diodes D2 and D3, which are serially connected in the same direction, a P-N-P transistor Tr1 and an N-P-N transistor Tr2. The wells constituting these members have parasitic resistances. In the protection circuit 12, however a power supply line is connected instead of the input/output pad I/O. The structures of the P-N junction diodes D5 and D6 are the same as that of the P-N junction diode D4 in the twelfth embodiment.

In the thirteenth embodiment of the above configuration, when either positive or negative surge against the ground terminal GND is loaded on the input/output pad I/O, the surge is released to the ground terminal GND in the same way as the twelfth embodiment. When a positive surge against the power supply terminal VDD is loaded on the input/output pad I/O, the protection circuit 11 becomes conductive and the P-N junction diode D6 is forward-biased. Then the positive surge is released to the power supply voltage terminal VDD via the protection circuit 11 and the P-N junction diode D6. Meanwhile, when a negative surge against the power supply terminal VDD is loaded on the input/output pad I/O, the P-N junction diode D5 is forward-biased and the protection circuit 12 becomes conductive. Then the negative surge is released to the power supply voltage terminal VDD via the P-N junction diode D5 and the protection circuit 12. In this way, the internal circuit can he protected from either positive or negative surge against the power supply terminal VDD.

Figure 18:
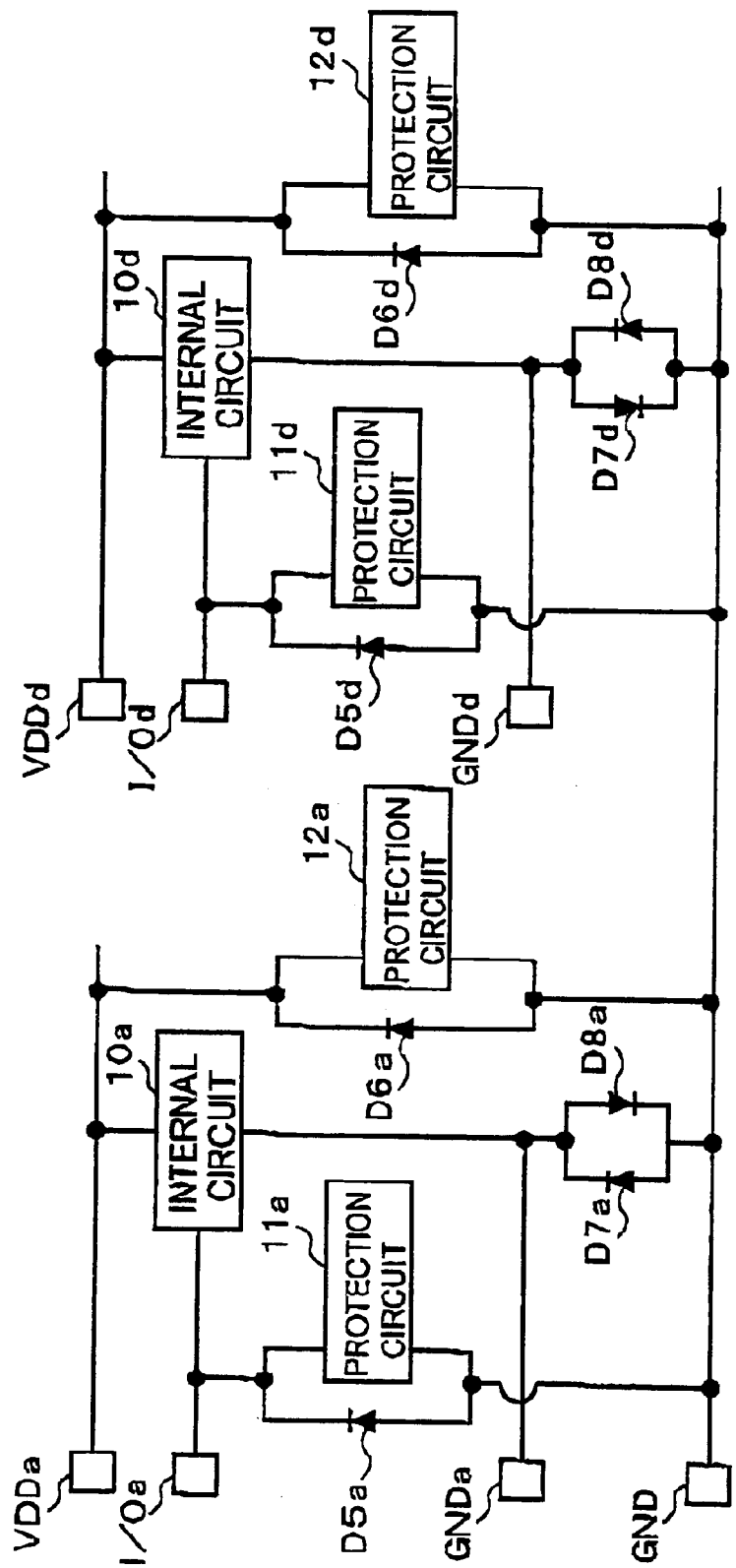
FIG. 18 is an equivalent circuit diagram of an ESD protection circuit according to a fourteenth embodiment of the present invention.

Next, a fourteenth embodiment of the present invention is described below. The fourteenth embodiment is the adoption of the present invention in a digital-analog combined circuit. FIG. 18 is the equivalent circuit diagram illustrating the structure of the ESD protection circuit according to the fourteenth embodiment. In the fourteenth embodiment, P-N junction diodes D5a and D6a and protection circuits 11a and 12a of the same configuration as FIG. 15 are formed to protect the internal circuit 10a that carries out analog processing, while P-N junction diodes D5d and D6d and protection circuits 11d and 12d of the same configuration as FIG. 15 are fond to protect the internal circuit 10d that carries out digital processing.

The internal circuit 10a is connected to the power supply terminal VDDa for the analog circuit and the ground terminal GNDa for the analog circuit, while the internal circuit 10d is connected to the power supply terminal VDDd for the digital circuit and the ground terminal GNDd for the digital circuit. Furthermore, a ground line is prepared that is connected to the ground terminal GND for surge release, and P-N junction diodes D5a, D5d, D6a and D6d as well as protection circuits 11a, 11d, 12a and 12d are connected to this ground line. Diodes D7a and D8a which are coupled in opposite directions to each other are connected in parallel between the ground line leading to the ground terminal GNDa and the ground line leading to the ground terminal GND. Meanwhile, diodes D7d and D8d which are coupled in opposite directions are connected in parallel between the ground line leading to the ground terminal GNDd and the ground line leading to the ground terminal GND.

In the fourteenth embodiment, it becomes possible to release surges between the lines of different power supplies. The diodes D7a, D7d, D8a and D8d are provided to prevent noise propagation between the ground lines.

Figure 19:
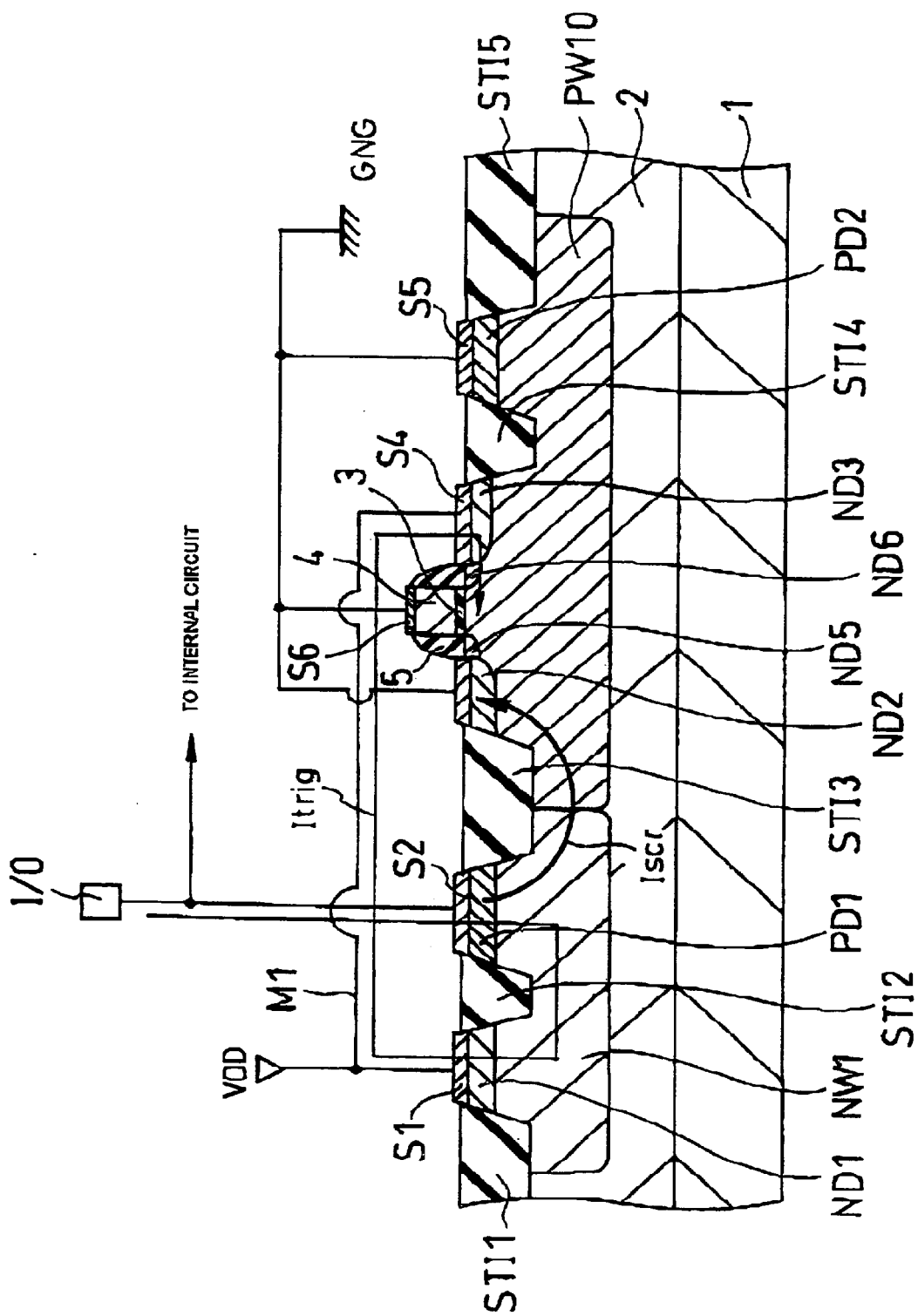
FIG. 19 is a sectional view illustrating the structure of an ESD protection circuit according to a fifteenth embodiment of the present invention.

The n-channel MOS transistor NMOS shown in the first embodiment is not required to be a p-type epitaxial layer 2. Instead, a P well including the channel of an n-channel MOS transistor NMOS and P wells PW1, PW2 may be formed for easy fabrication of mask and other factors. The fifteenth embodiment is the embodiment where a P well is formed to include the channel of a MOS transistor NMOS and P wells PW1, PW2 in accordance with the first embodiment. FIG. 19 is a sectional view of the ESD protection circuit according to the fifteenth embodiment of the present invention. The constituting elements common in the fifteenth embodiment shown in FIG. 19 and the first embodiment shown in FIG. 4 have the same symbols, and their details are not described again here.

In the fifteenth embodiment, instead of the P wells PW1 and PW2, a P well PW10 is formed that extends from beneath the device isolation film STI3 to beneath STI5.

In the fifteenth embodiment of this configuration, the p+ diffusion layer PD1, N well NW1 and P well PW10 constitute a transistor Tr1, while the N well NW1, P well PW10 and n+ diffusion layer ND2 constitute a transistor Tr2, for the same operation as the first embodiment.

When fabricating the ESD protection circuit according to the fifteenth embodiment, the P well PW10, instead of P wells PW1 and PW2, is formed by the manufacturing method according to the first embodiment.

Figure 20:
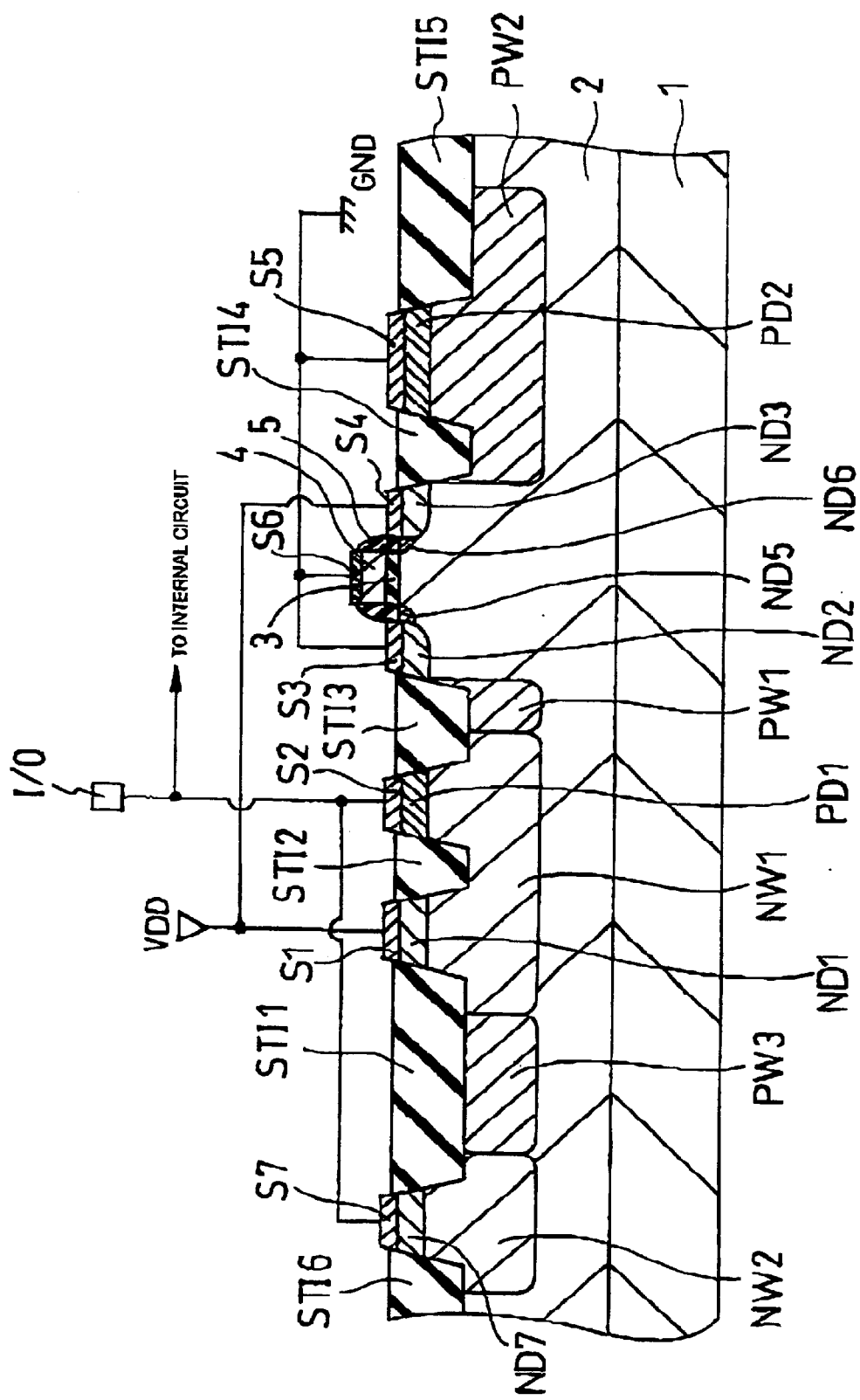
FIG. 20 is a sectional view illustrating the structure of an ESD protection circuit according to a sixteenth embodiment of the present invention.
Figure 21A:
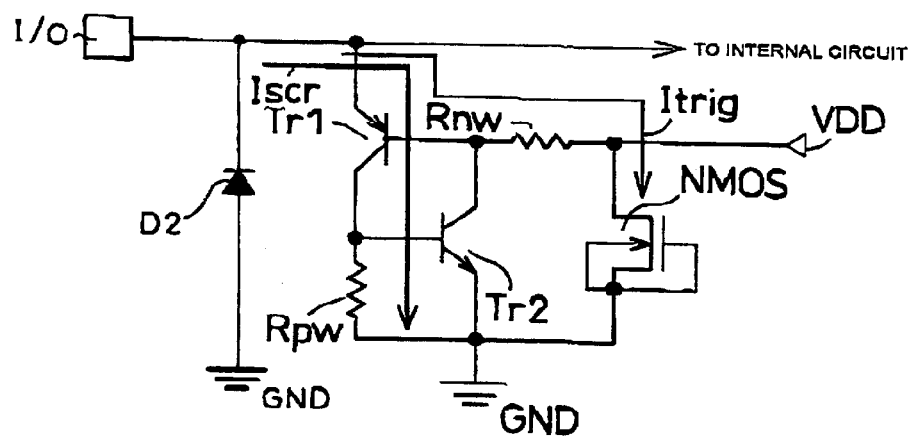
FIG. 21A is an equivalent circuit showing the ESD protection circuit according to the sixteenth embodiment.
Figure 21B:
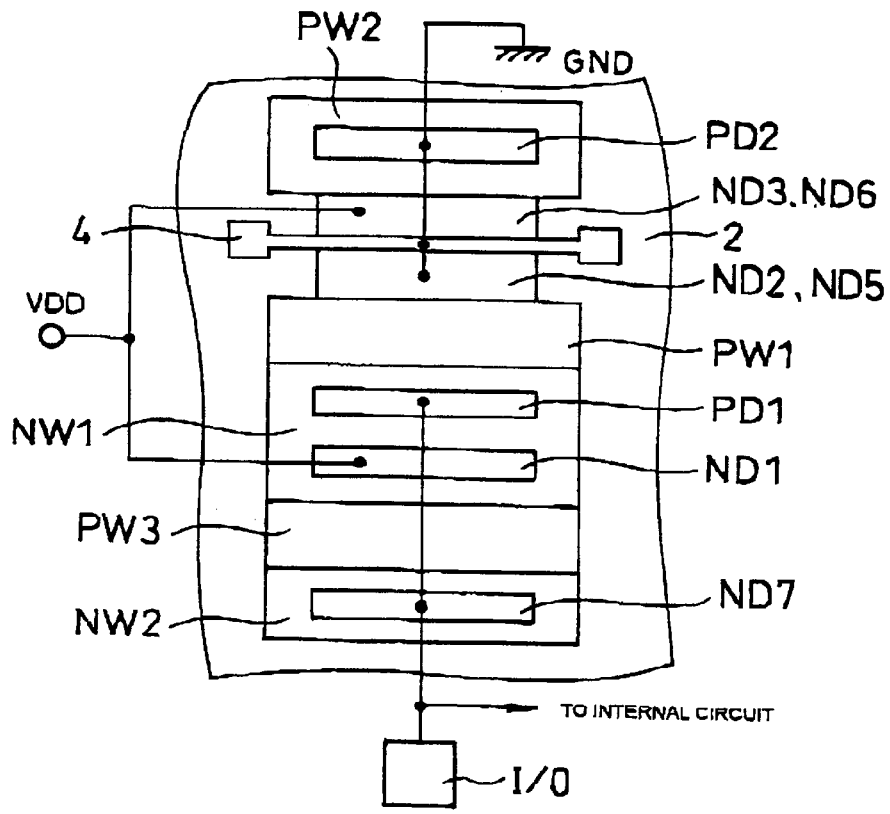
FIG. 21B is a plan view thereof.

Next, a sixteenth embodiment of the present invention is now described below. FIG. 20 is a sectional view of the ESD protection circuit according to the sixteenth embodiment of the present invention; FIG. 21A is its equivalent circuit diagram; and FIG. 21B is its layout diagram. The constituting elements common in the sixteenth embodiment shown in FIGS. 20 and 21 and the first embodiment shown in FIGS. 4 and 5 have the same symbols, and their details are not described again here.

In the sixteenth embodiment, as shown in FIGS. 20 and 21B, a P well PW3 is formed on the surface of the p-type epitaxial layer 2 to be adjacent to the N well NW1 beneath the device isolation film STI1, and an N well NW 2 adjacent to this P well PW3 is formed to extend outside the device isolation film STI1. At the end of the N well NW2, a device isolation film STI6 is formed of a shallow trench isolation (STI) film. An n+ diffusion layer ND7 is formed on the surface of the N well NW2, and on its top a silicide layer S7 is formed. This silicide layer S7 is connected to the input/output pad I/O.

In this embodiment of the above configuration, as shown in FIG. 21A, the p+ diffusion layer PD2, P well PW2, p-type epitaxial layer 2, N well NW2 and no diffusion layer ND7 constitute a P-N junction diode D2.

Thus when a positive surge against the ground terminal GND is loaded on the input/output pad I/O, the surge is released to the ground terminal GND, as is the case with the first embodiment. Meanwhile, when a negative surge against the ground terminal GND is loaded on the input/output pad I/O, the P-N junction diode D2 is forward-biased, and the negative surge is released to the ground terminal GND. In this way, the internal circuit can be protected from either positive or negative surge.

In order to fabricate the ESD protection circuit in accordance with the sixteenth embodiment, the N well NW 2 is formed together with the N well NW1, the P well PW3 is formed together with the P well PW1, the n+ diffusion layer ND7 is formed together with the n+ diffusion layer ND1 and other n+ diffusion layers, the cobalt suicide layer S7 is formed together with the cobalt silicide layer S1 and other silicide layers, and the wire connected to the input/output pad I/O is connected to the n+ diffusion layer ND7 as well, in the process for fabricating the device according to the first embodiment.

Figure 22:
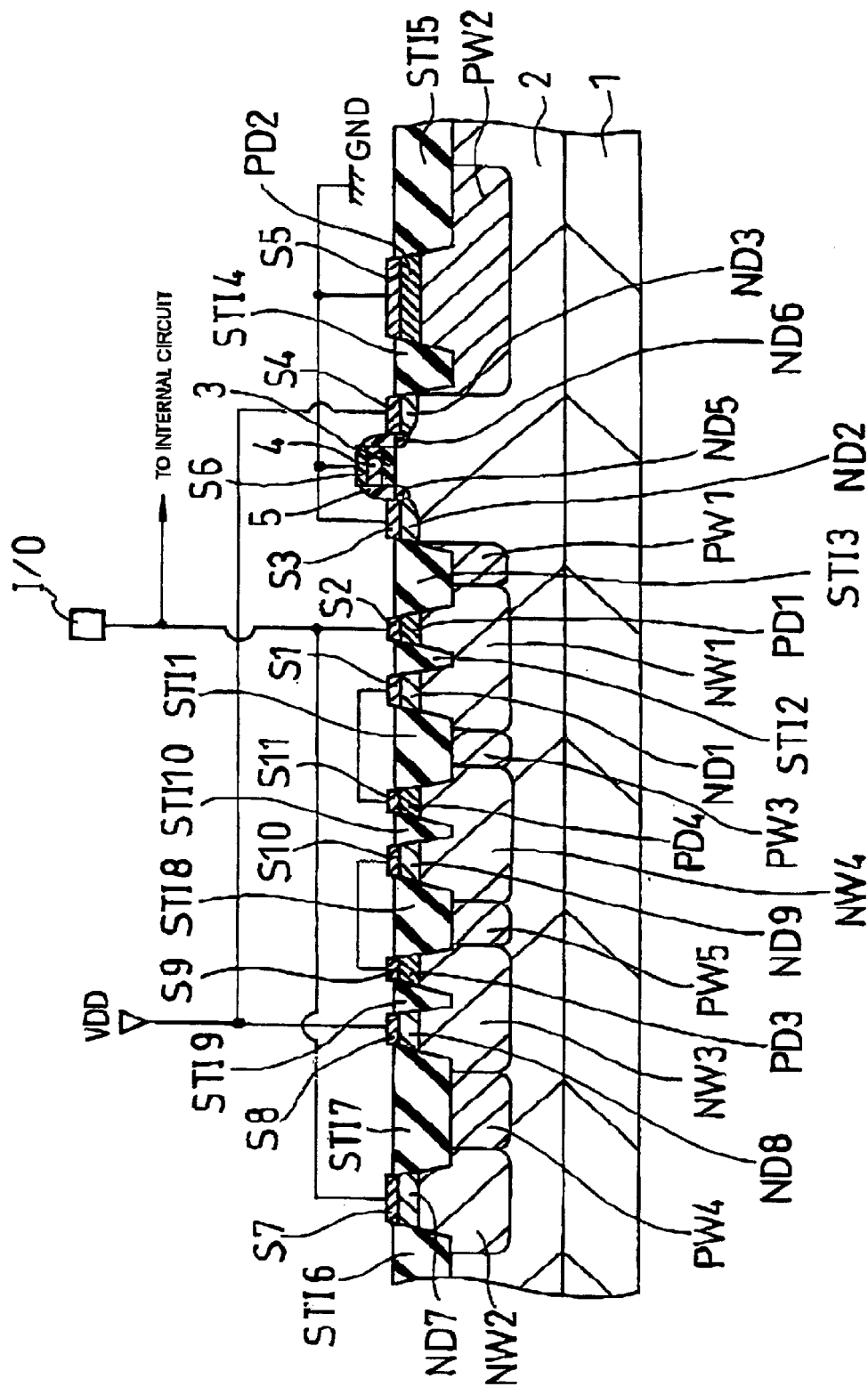
FIG. 22 is a sectional view illustrating the structure of an ESD protection circuit according to a seventeenth embodiment of the present invention.
Figure 23:
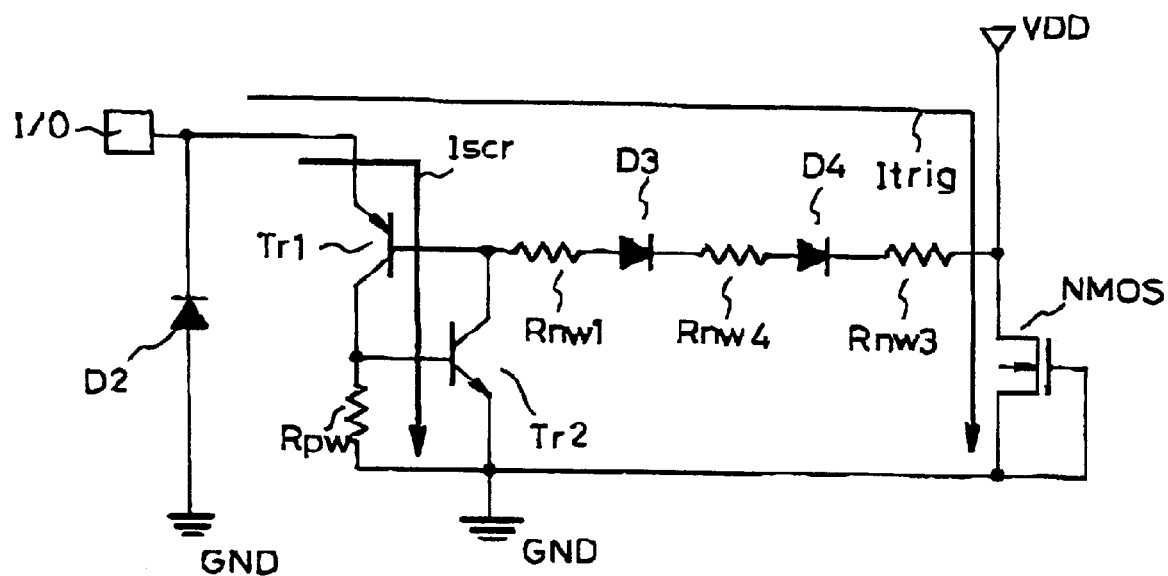
FIG. 23 is an equivalent circuit diagram of the ESD protection circuit according to the seventeenth embodiment.

Next, a seventeenth embodiment is described below. FIG. 22 is a sectional view of the ESD protection circuit according to the seventeenth embodiment of the present invention; FIG. 23 is its equivalent circuit diagram; and FIG. 24 is its layout diagram The constituting elements common in the sixteenth embodiment shown in FIGS. 20 and 21 and the seventeenth embodiment shown in FIGS. 22–24 have the same symbols, and their details are not described again here.

Figure 24:
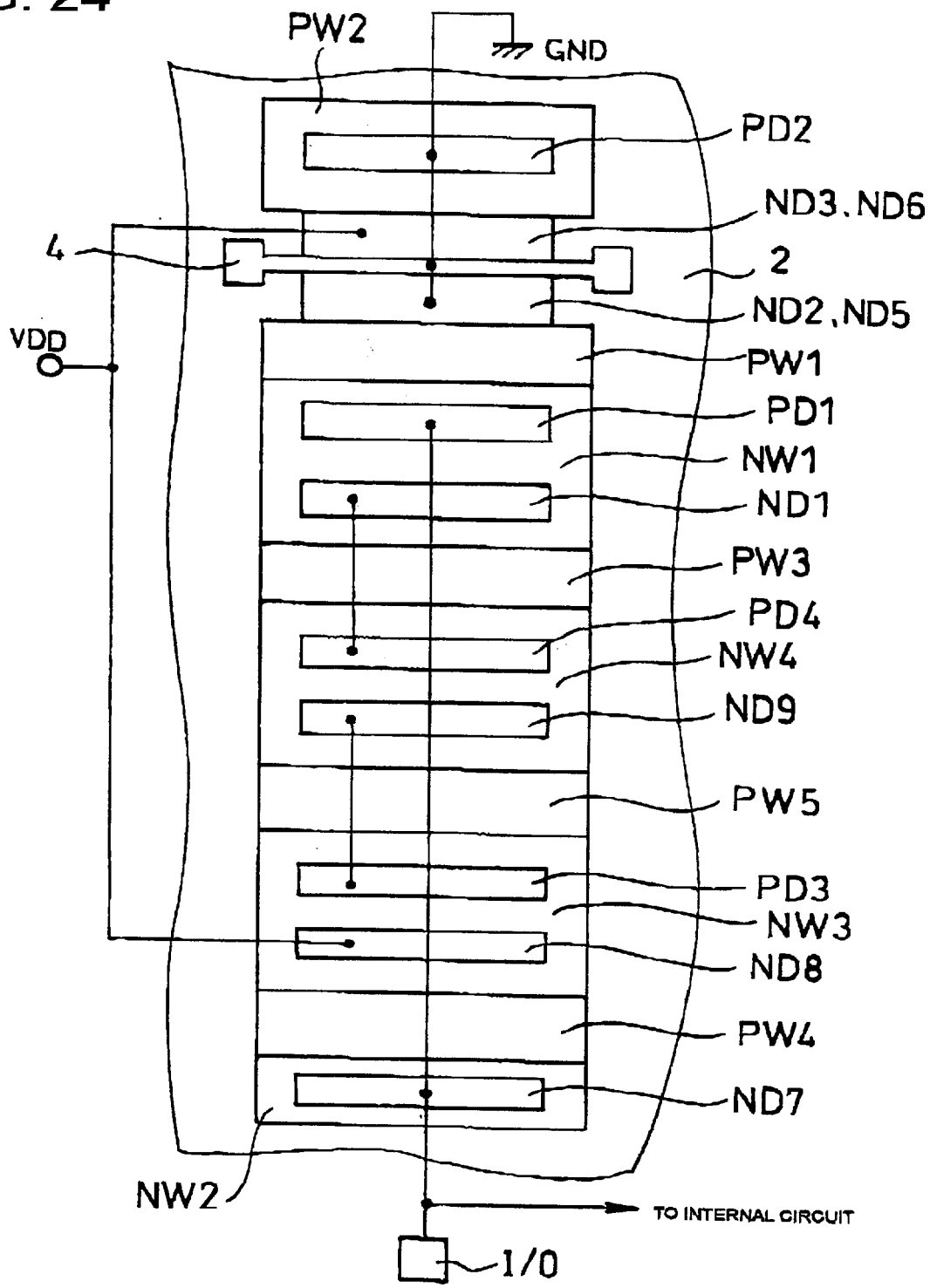
FIG. 24 is a plan view of the ESD protection circuit according to the seventeenth embodiment.

Referring now to FIGS. 22–24, an N well NW4, P well PW5, N well NW3 and P well PW4 are formed in this order between the P well PW3 and the N well NW2, in the seventeenth embodiment. A device isolation film STI7 is formed of a shallow trench isolation (STI) film to cover the P well PW4 between the N well NW2 and N well NW3, while a device isolation film STI8 is formed of a shallow trench isolation (STI) film to Cover the P well PW5 between the N well NW3 and N well NW4. Besides, device isolation films STI9 and STI10 are formed of shallow trench isolation (STI) films to divide the surface of each of the N wells NW3 and NW4 into two. An n+ diffusion layer ND8 is formed between the device isolation films STI7 and STI9 on the surface of the N well NW3, while a p+ diffusion layer PD3 is formed between the device isolation films STI9 and STI8. Cobalt silicide layers S8 and S9 are formed on the n+ diffusion layer ND8 and the p+ diffusion layer PD3, respectively. An n+ diffusion layer ND9 is formed between the device isolation films STI8 and STI10 on the surface of the N well NW4, while a p+ diffusion layer PD4 is formed between the device isolation films STI10 and STI11. Cobalt silicide layers S10 and S11 are formed on the n+ diffusion layer ND9 and the p+ diffusion layer PD4, respectively.

The power supply voltage terminal VDD is not connected to the cobalt silicide layer S1 but to the cobalt silicide layer S8. The cobalt silicide layer S1 is connected to the cobalt silicide layer S11, while the cobalt silicide layer S10 is connected to the cobalt silicide layer S9.

Referring now to FIG. 23, in the seventeenth embodiment of the above configuration, the p+ diffusion layer PD4, N well NW4 and n+ diffusion layer ND9 constitute a P-N junction diode D3, while the p+ diffusion layer PD3, N well NW3 and n+ diffusion layer ND8 constitute a P-N junction diode D4. Namely, the diodes D3 and D4 are serially connected. Besides, a resistance Rnw4 parasitizes the N well NW4, while a resistance Rnw3 parasitizes the N well NW3.

Provided that the diodes D3 and D4 become conductive at about 0.5V, a leak current flows from the input/output pad I/O to the power supply voltage terminal VDD, if the 1.5V power supply voltage supplied to the power supply voltage terminal VDD during normal operation in the first to third embodiments falls for any reason and a signal voltage of about 1.5V is inputted into the input/output pad I/O. Then malfunction occur in the integrated circuit. On the other hand, according to the seventeenth embodiment, there is no leak current to the power supply voltage terminal VDD, even if the power supply voltage VDD falls and a signal voltage of about 1.5V is applied to the input/output pad I/O. Malfunctions in IC can thereby be prevented (fail-safe function.

In order to fabricate the ESD protection circuit in accordance with the seventeenth embodiment, the N wells NW3, NW4 are formed together with the N well NW1, the P wells PW4, PW5 are formed together with the P well PW1 and other P wells, the n+ diffusion layers ND8, ND9 are formed together with the n+ diffusion layer ND1 and other n+ diffusion layers, the p+ diffusion layers PD3, PD4 are formed together with the p+ diffusion layer PD1 and other p4 diffusion layers, the cobalt silicide layers S8–S11 are formed together with the cobalt silicide layer S1 and other silicide layers, and the wires are formed to connect the cobalt silicide layers S9 to the cobalt silicide layer S10 and connect the cobalt silicide layer S1 to the cobalt silicide layer S11.

As is the case with the fifteenth embodiment, a P well may be formed in the channel of the n-channel MOS transistor NMOS also in the sixteenth and seventeenth embodiments.

Figure 25:
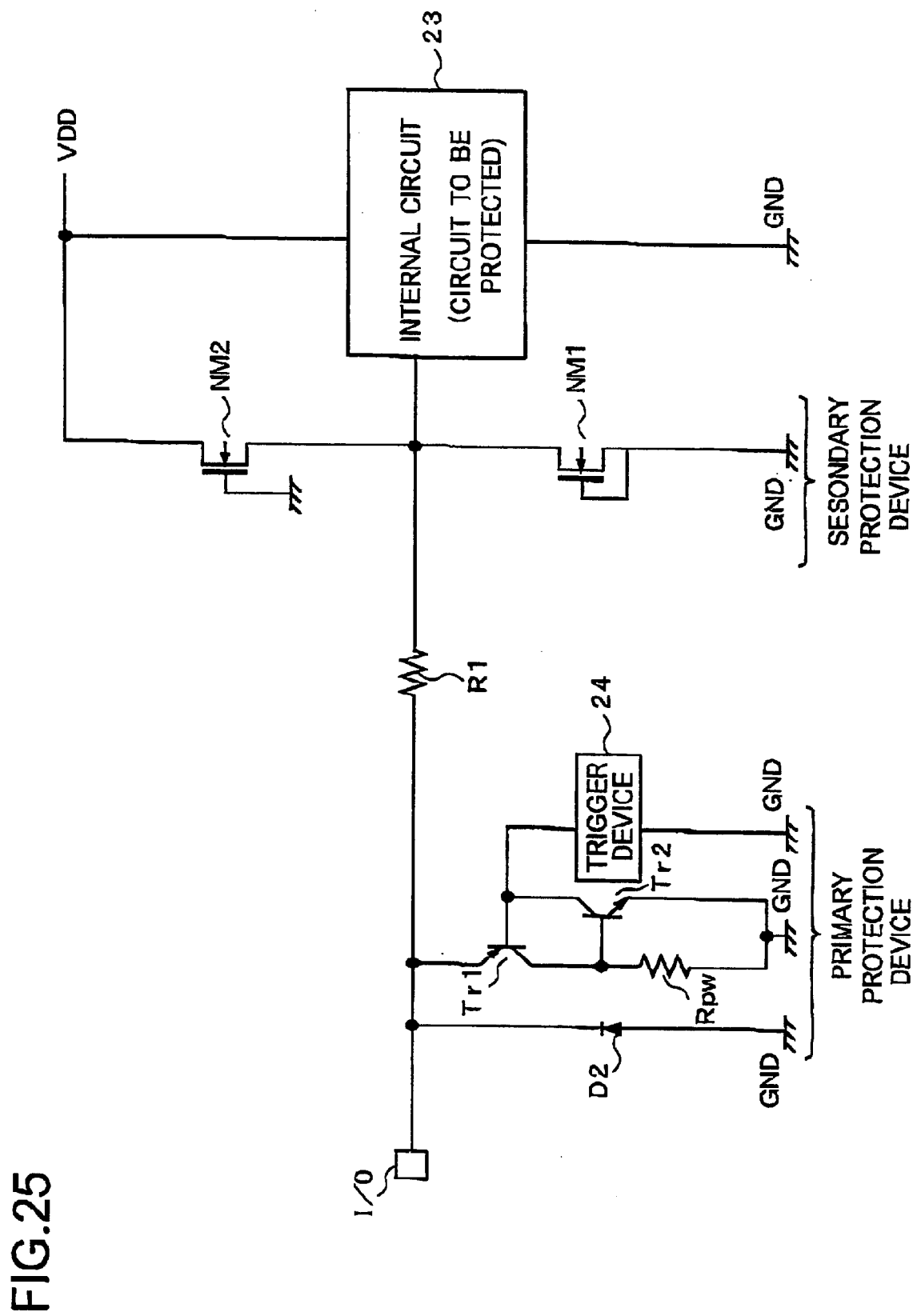
FIG. 25 is an equivalent circuit diagram illustrating the application of a secondary protection device according to the seventeenth embodiment.

It is preferable to install a secondary protection device between the input/output pad I/O and the internal circuit, along with the ESD protection circuit, described in the preceding embodiments, as the primary protection device. FIG. 25 is an equivalent circuit diagram illustrating the application of a secondary protection device according to the seventeenth embodiment. The primary protection device has a trigger device 24. For example, the secondary protection device can consist of a resistor R1, an n-channel MOS transistor NM1 and an n-channel MOS transistor NM2. The resistor R1 is connected between the input/output pad I/O and the internal circuit (the circuit to be protected) 23. The drain of the n-channel NOS transistor NM1 is connected in between this resistor R1 and the internal circuit 23, and source and gate of the n-channel MOS transistor NM1 are connected to a ground terminal GND. The drain of the n-channel MOS transistor NM2 is connected in between the resistor R1 and the internal circuit 23, the gate of the n-channel MOS transistor NM2 is connected a ground terminal GND, and the source of the n-channel MOS transistor NM2 is connected to the power supply voltage terminal VDD. The configuration of the secondary protection device, however, is not limited by this example.

The conductivity types of wells and diffusion layers may be opposite to those employed in the above embodiments. In this case, the connections to the input/output pad I/O and the ground terminal are exchanged.

Although a p-type epitaxial layer 2 is formed on the p-type semiconductor substrate 1 in those embodiments, the p-type epitaxial layer 2 is not essential. Instead, P wells PW1, PW2 and N well NW1 and others may be directly formed on the surface of the p-type semiconductor substrate 1. Although the embodiments have used metallic wires for the wiring of the trigger device, the present invention is not limited to this example. Instead of metallic materials, other conductive materials such as TiN may be used for wiring. The input/output pad I/O, described in the preceding embodiments, may be a pad of an input circuit impressed an input signal from an externally terminal, a pad of an output circuit, or a power source pad is connected to a power Supply voltage terminal and an internal circuit, and supplies power supply voltage to the internal circuit. In either case, the effect of the present invention can be realized.

Figure 26A:
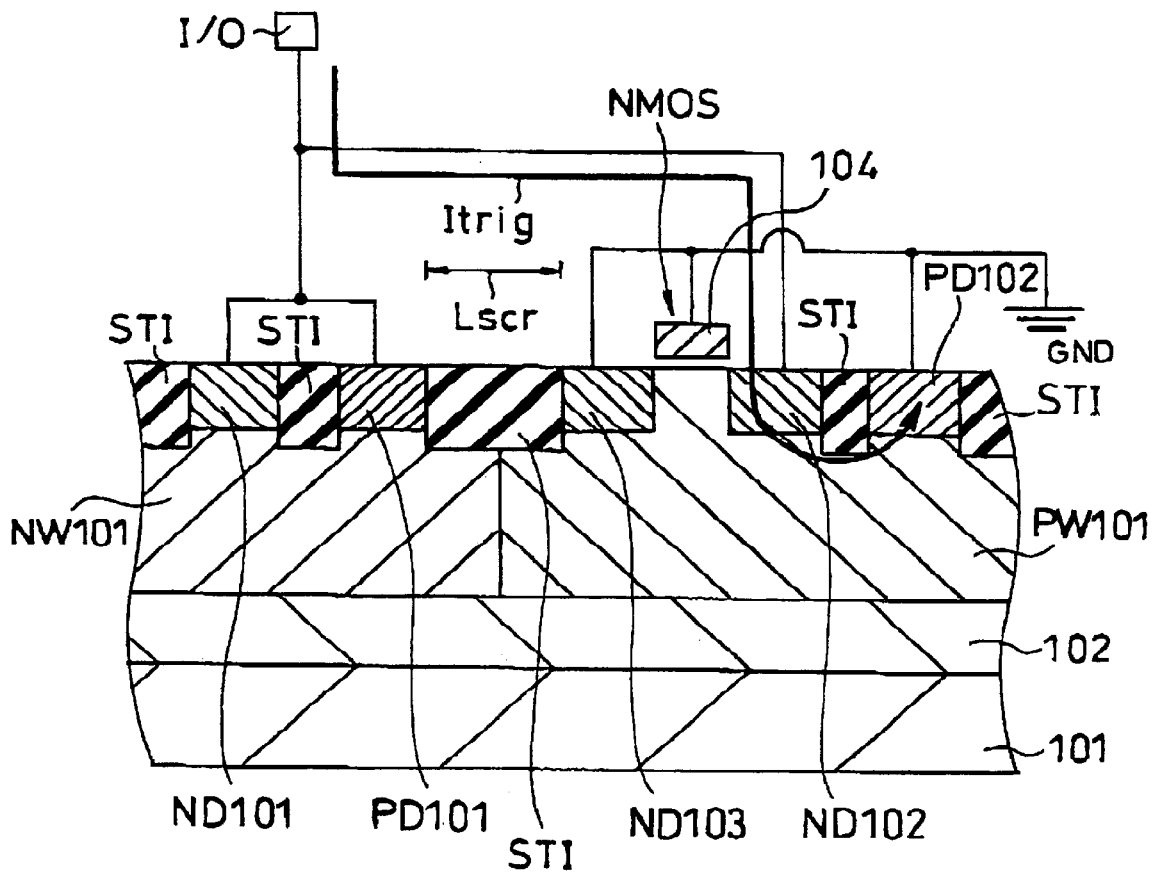
FIG. 26A is a sectional view illustrating the structure of an ESD protection circuit according to a comparative example for the present invention.
Figure 26B:
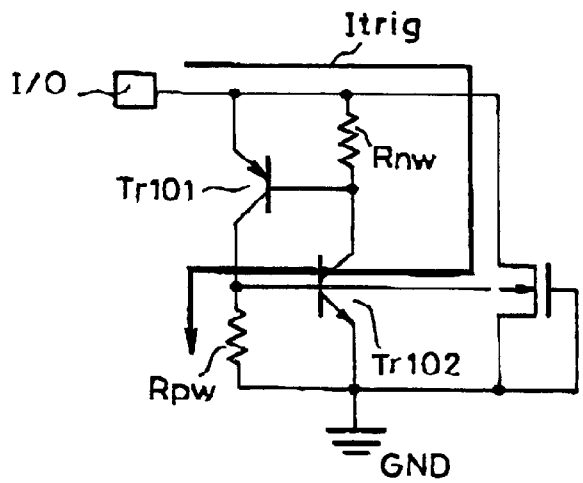
FIG. 26B is an equivalent circuit diagram thereof.

The following is the explanation of a comparative example that does not fall in the scope of the present invention. FIG. 26 is a diagram illustrating such a comparative example; FIG. 26A is a sectional view of the device in accordance with the comparative example; and FIGS. 26B is its equivalent circuit diagram. In this comparative example, the positions of the source and drain of the MOS transistor are exchanged, compared with the prior art ESD protection circuit shown in FIG. 1A. Namely, referring now to FIG. 26A, the positions of the n+ diffusion layer ND102 and n+ diffusion layer ND103 are exchanged in the transistor NMOS, and a device isolation film STI is formed between the n+ diffusion layer ND103 and p+ diffusion layer PD101, in the ESD protection circuit according to this comparative example. The input/output pad I/O is connected not only to the n+ diffusion layer ND101 and p+ diffusion layer PD101 but also to the n+ diffusion layer ND102.

Figure 1A:
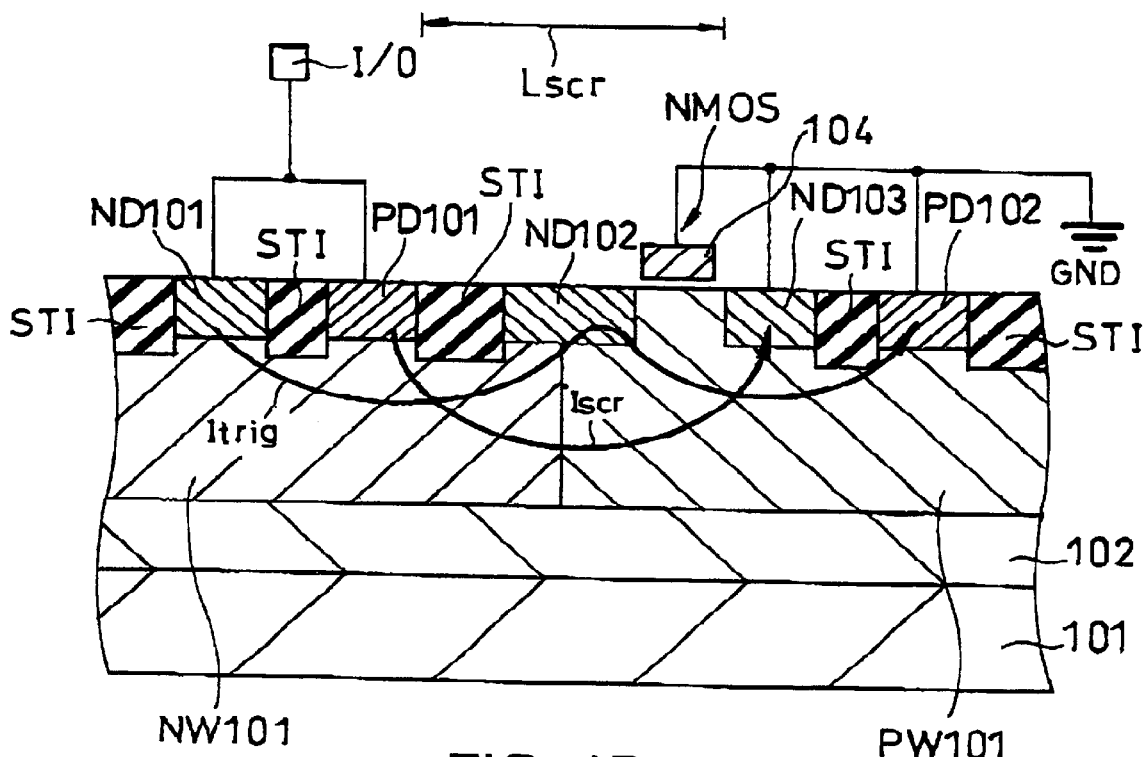
FIG. 1A in a sectional view illustrating the structure of a prior art ESD protection circuit.
Figure 1B:
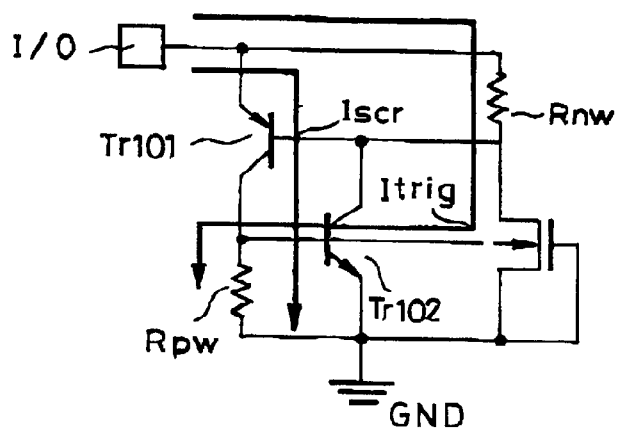
FIG. 1B is an equivalent circuit diagram thereof.
Figure 2A:
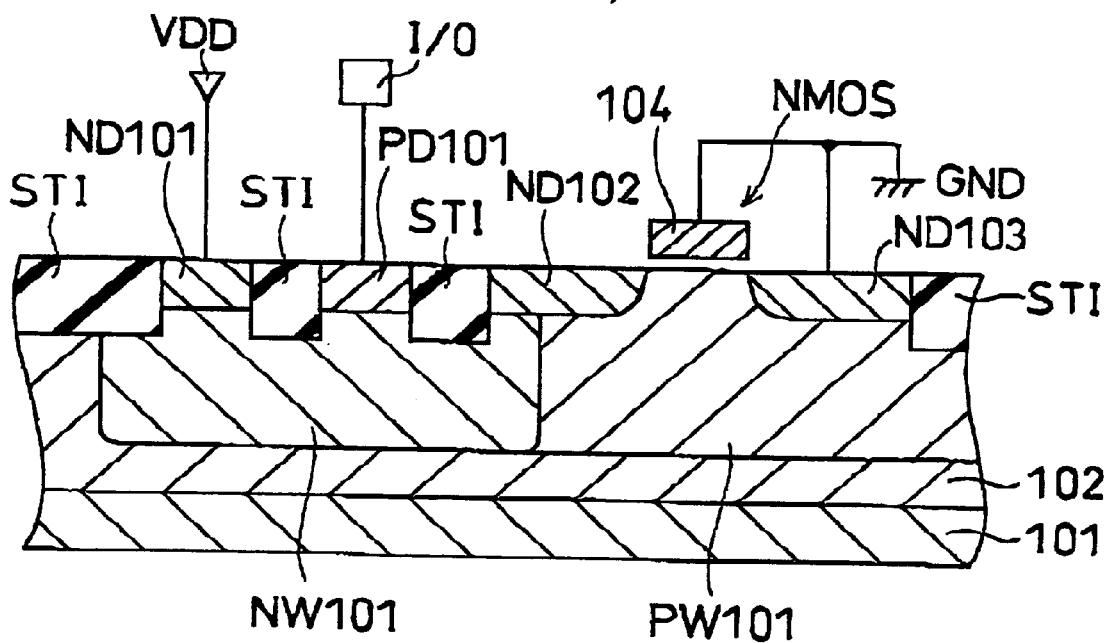
FIG. 2A is a sectional view illustrating the structure of another prior art ESD protection circuit.
Figure 2B:
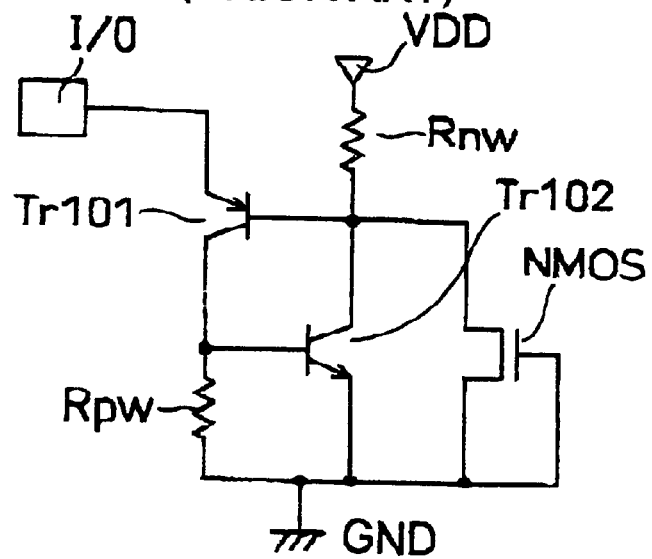
FIG. 2B is an equivalent circuit diagram thereof.
Figure 3A:
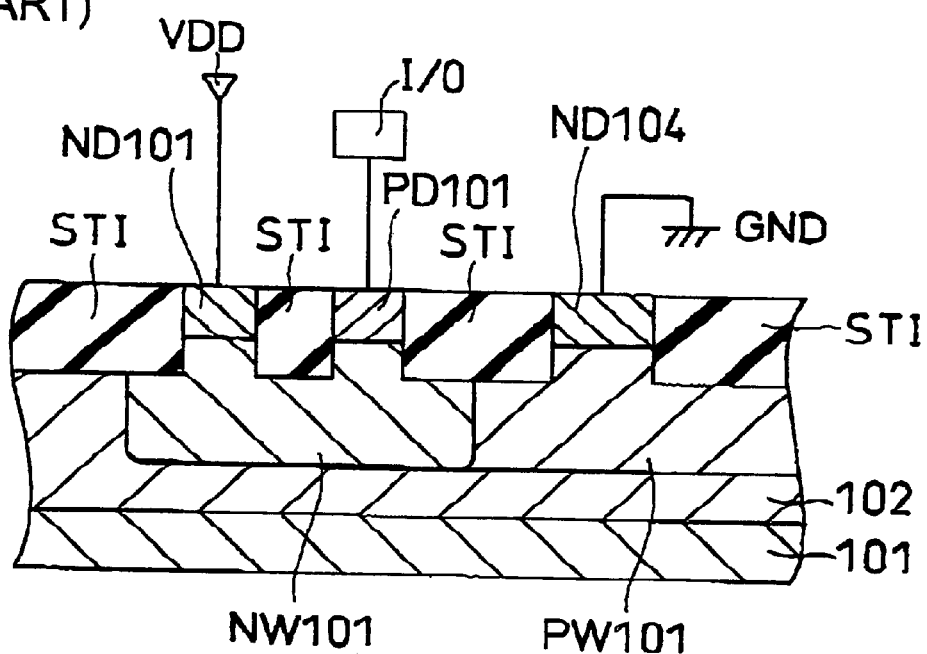
FIG. 3A is a sectional view illustrating the structure of another prior art ESD protection circuit.
Figure 3B:
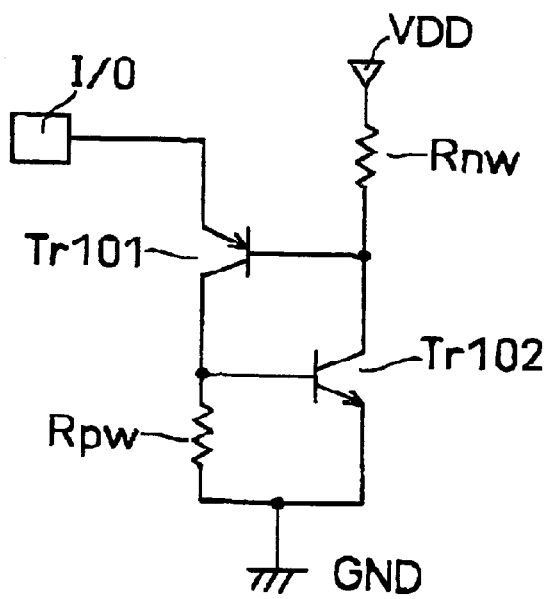
FIG. 3B is an equivalent circuit diagram thereof.

According to this configuration, as is the case with the prior art shown in FIG. 1A, the p+ diffusion layer PD101, N well NW101, P well PW101 and n+ diffusion layer N103 constitute a SCR. Since the distance Lscr between the anode and the cathode is shortened, the ESD-performance was expected to move.

However, there was a problem in its operation then a positive surge against the ground terminal GND is loaded on the input/output pad I/O, a breakdown occurs between the drain (n+ diffusion layer ND102) of the transistor NMOS and its channel (P well PW101), and a trigger current Itrig flows to the ground terminal GND via the n+ diffusion layer ND102 and P well PW101. As a result, the potential of the P well PW101 is raised by the parasitic resistance Rpw parasitizing the P well PW101. However, as shown in FIG. 26B, the potential of the N well NW101 does not fall because no current runs in the parasitic resistance Rnw parasitizing the N well NW101. Unless the driving capability of the transistor NMOS is extremely high, the SCR comprising the p+ diffusion layer PD101, N well NW101, P well PW101 and n+ diffusion layer ND103 is not activated. Then, MOS transistor NMOS is destroyed before the SCR is activated.

What is claimed is:

1. An ESD protection circuit for a semiconductor integrated circuit, comprising:

a first-conductivity type semiconductor substrate;

a second-conductivity type well formed in said semiconductor substrate;

a first first-conductivity type diffusion layer, being formed in said second-conductivity type well, that is connected to a pad;

a first second-conductivity type diffusion layer, being formed in said second-conductivity type well;

a second second-conductivity type diffusion layer, formed in a part other than said second-conductivity type well of said semiconductor substrate, that is connected to a reference voltage terminal; and a trigger device having two terminals in which the one terminal is connected to said first second-conductivity type diffusion layer via wiring and in which the other terminal is connected to a reference voltage terminal, for allowing electric current to flow when a voltage higher than a predetermined value is applied between said two terminals.

2. The ESD protection circuit for a semiconductor integrated circuit according to claim 1, wherein said trigger device is a MOS transistor of which a drain is a third second-conductivity type diffusion layer formed in said semiconductor substrate and connected to said first second-conductivity type diffusion layer via said wiring, and of which a source is said second second-conductivity type diffusion layer formed in said semiconductor substrate.

3. The ESD protection circuit for a semiconductor integrated circuit according to claim 2, wherein said second second-conductivity type diffusion layer is located in a region between said second-conductivity type well and said third second-conductivity type diffusion layer.

4. The ESD protection circuit for a semiconductor integrated circuit according to claim 1, wherein said trigger device is a MOS transistor of which a drain is a third second-conductivity type diffusion layer formed in said semiconductor substrate and connected to said first second-conductivity type diffusion layer via said wiring, and of which a source is a forth second-conductivity type diffusion layer formed in said semiconductor substrate and connected to a reference voltage terminal.

5. The ESD protection circuit for a semiconductor integrated circuit according to claim 4, wherein said MOS transistor comprises:

an isolation film formed on a region between said third second-conductivity type diffusion layer and said forth second-conductivity type diffusion layer in said semiconductor substrate;

a gate electrode film formed on said isolation film;

a capacitative element connected between said third second-conductivity type diffusion layer and said gate electrode film; and a resistive element connected between said gate electrode film and said forth second-conductivity type diffusion layer.

6. The ESD protection circuit for a semiconductor integrated circuit according to claim 4, wherein said MOS transistor comprises:

an isolation film formed on a region between said third second-conductivity type diffusion layer and said forth second-conductivity type diffusion layer in said semiconductor substrate;

a gate electrode film formed on said isolation film;

a capacitative element connected to said third second-conductivity type diffusion layer;

a resistive element connected to said forth second-conductivity type diffusion layer; and a delay circuit connected between said gate electrode film and the node which is located between the side opposite to the side connected to said third second-conductivity type diffusion layer of said capacitative element and the side opposite to the side connected to said forth second-conductivity type diffusion layer.

7. The ESD protection circuit for a semiconductor integrated circuit according to claim 2, further comprising a diode of which anode is connected to said first second-conductivity type diffusion layer and of which cathode is connected to said third second-conductivity type diffusion layer.

8. The ESD protection circuit for a semiconductor integrated circuit according to claim 7, wherein said diode consists of a plurality of P-N diodes which are cascade connected each other and are formed in a part other than said second-conductivity type well of said semiconductor substrate.

9. The ESD protection circuit for a semiconductor integrated circuit according to claim 1, wherein said first second-conductivity type diffusion layer is connected to a power supply voltage terminal.

10. The ESD protection circuit for a semiconductor integrated circuit according to claim 1, wherein said trigger device is a diode, formed in a part other than said second-conductivity type well of said semiconductor substrate, of which anode is connected to said first second-conductivity type diffusion layer via said wiring and of which cathode is connected to a reference voltage terminal.

11. The ESD protection circuit for a semiconductor integrated circuit according to claim 10, wherein said diode consists of a plurality of P-N diodes which are cascade connected each other and are formed in a part other than said second-conductivity type well of said semiconductor substrate.

12. The ESD protection circuit for a semiconductor integrated circuit according to claim 1, wherein a distance between said first first-conductivity type diffusion layer and an end face of said second-conductivity type well, the end face being located in a region between said first first-conductivity type diffusion layer and said second second-conductivity type diffusion layer, is smaller than a depth of said second-conductivity type well.

13. The ESD protection circuit for a semiconductor integrated circuit according to claim 1, further comprising a first-conductivity type well formed adjacent to said second-conductivity type well in said first-conductivity type semiconductor substrate.

14. The ESD protection circuit for a semiconductor integrated circuit according to claim 1, further comprising a diode of which cathode is connected to said first first-conductivity type diffusion layer and of which anode is connected to a reference voltage terminal.

15. The ESD protection Circuit for a semiconductor integrated circuit according to claim 1, wherein said pad is connected to an external input terminal, an external output terminal or a power supply voltage terminal.

16. The ESD protection circuit for a semiconductor integrated circuit according to claim 1, further comprising a second first-conductivity type diffusion layer formed in a part other than said second-conductivity type well of said semiconductor substrate and connected to a reference voltage terminal.

* * * * *